(12) United States Patent
Lee

(10) Patent No.: US 10,925,176 B2
(45) Date of Patent: *Feb. 16, 2021

(54) DISPLAY APPARATUS

(71) Applicant: Samsung Display Co., Ltd., Yongin-si (KR)

(72) Inventor: Sangwol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/551,245

(22) Filed: Aug. 26, 2019

(65) Prior Publication Data
US 2019/0380219 A1 Dec. 12, 2019

Related U.S. Application Data

(63) Continuation of application No. 16/171,138, filed on Oct. 25, 2018, now Pat. No. 10,420,233, which is a
(Continued)

(30) Foreign Application Priority Data

Jul. 28, 2017 (KR) ........................ 10-2017-0096505

(51) Int. Cl.
*G06F 1/16* (2006.01)
*H05K 5/02* (2006.01)
(Continued)

(52) U.S. Cl.
CPC ............. *H05K 5/0226* (2013.01); *E05D 3/18* (2013.01); *E05D 11/06* (2013.01); *G06F 1/1618* (2013.01);
(Continued)

(58) Field of Classification Search
CPC ... G06F 1/1652; G06F 1/1681; H04M 1/0268
(Continued)

(56) References Cited

U.S. PATENT DOCUMENTS 8,509,423 B2 * 8/2013 Hsu ........................ G06F 1/1624
379/433.12
8,583,195 B2 * 11/2013 Dearden ................... A45F 5/00
455/573
(Continued)

FOREIGN PATENT DOCUMENTS

JP 2011-119830 A 6/2011
KR 10-2011-0100936 A 9/2011
(Continued)

*Primary Examiner* — Adrian S Wilson
(74) *Attorney, Agent, or Firm* — Lewis Roca Rothgerber Christie LLP

(57) ABSTRACT

A display apparatus includes: a first support member and a second support member; a plurality of joint units connected to the first and second support members and coupled to be rotatable with respect to each other; a display module on the first and second support members; third and fourth support members under the first and second support members, respectively; and a hinge member respectively providing rotation axes to one side of the third support member and one side of the fourth support member facing each other. The joint units are arranged along at least one curved trajectory when the third and fourth support members rotate on the rotation axes, respectively. The at least one curved trajectory is defined as a partial curved line of a reference circle, and a central point of the reference circle is spaced apart from the first and second rotation axes.

26 Claims, 24 Drawing Sheets

Related U.S. Application Data continuation of application No. 15/868,785, filed on Jan. 11, 2018, now Pat. No. 10,143,098.

(51) Int. Cl.
| | | |
|---|---|---|
| *E05D 3/18* | (2006.01) | |
| *E05D 11/06* | (2006.01) | |
| *H05K 5/00* | (2006.01) | |
| *H05K 5/03* | (2006.01) | |
| *G06F 3/041* | (2006.01) | |
| *H04M 1/02* | (2006.01) | |

(52) U.S. Cl.
CPC .......... *G06F 1/1643* (2013.01); *G06F 1/1652* (2013.01); *G06F 1/1681* (2013.01); *G06F 3/041* (2013.01); *G06F 3/0416* (2013.01); *H04M 1/022* (2013.01); *H04M 1/0268* (2013.01); *H05K 5/0017* (2013.01); *H05K 5/03* (2013.01); *E05Y 2900/606* (2013.01); *G06F 2203/04102* (2013.01)

(58) Field of Classification Search
USPC ...................................................... 455/575.4
See application file for complete search history.

(56) References Cited

U.S. PATENT DOCUMENTS

| | | | |
|---|---|---|---|
| 8,804,349 B2 | 8/2014 | Lee et al. | |
| 9,348,450 B1* | 5/2016 | Kim | G06F 1/1681 |
| 9,442,530 B2* | 9/2016 | Maatta | G06F 1/1656 |
| 10,015,897 B1* | 7/2018 | Hong | G09F 9/301 |
| 10,420,233 B2* | 9/2019 | Lee | E05D 11/06 |
| 10,499,515 B2* | 12/2019 | Lee | H05K 1/028 |
| 10,651,419 B2* | 5/2020 | Lee | H05K 1/147 |
| 2002/0132633 A1* | 9/2002 | Johnson | H04M 1/0237 |
| | | | 455/575.4 |
| 2006/0079277 A1* | 4/2006 | Ditzik | G06F 1/1679 |
| | | | 455/556.1 |
| 2007/0117600 A1* | 5/2007 | Robertson, Jr. | H04M 1/0216 |
| | | | 455/575.3 |
| 2007/0155447 A1* | 7/2007 | Gordecki | H04M 1/0237 |
| | | | 455/575.4 |
| 2008/0174089 A1* | 7/2008 | Ekberg | A63C 5/02 |
| | | | 280/603 |
| 2010/0232100 A1* | 9/2010 | Fukuma | H04M 1/0216 |
| | | | 361/679.01 |
| 2011/0000136 A1* | 1/2011 | Brun | E05D 11/0081 |
| | | | 49/358 |
| 2012/0147542 A1* | 6/2012 | Kim | G06F 1/1683 |
| | | | 361/679.28 |
| 2012/0307472 A1* | 12/2012 | Bohn | G06F 1/1652 |
| | | | 361/807 |
| 2013/0216740 A1* | 8/2013 | Russell-Clarke | B65D 85/00 |
| | | | 428/33 |
| 2013/0219663 A1* | 8/2013 | Cai | G06F 1/1681 |
| | | | 16/371 |
| 2014/0111954 A1* | 4/2014 | Lee | G06F 1/1641 |
| | | | 361/749 |
| 2014/0126133 A1* | 5/2014 | Griffin | G06F 1/1652 |
| | | | 361/679.27 |
| 2014/0174226 A1* | 6/2014 | Hsu | G06F 1/1681 |
| | | | 74/98 |
| 2014/0196253 A1* | 7/2014 | Song | G06F 1/1681 |
| | | | 16/225 |
| 2014/0196254 A1* | 7/2014 | Song | E05D 3/14 |
| | | | 16/302 |
| 2014/0217875 A1* | 8/2014 | Park | G06F 1/1681 |
| | | | 312/326 |
| 2014/0226275 A1* | 8/2014 | Ko | G06F 1/1681 |
| | | | 361/679.27 |
| 2014/0245569 A1* | 9/2014 | Cho | E05D 3/122 |
| | | | 16/370 |
| 2015/0176317 A1* | 6/2015 | Lee | E05D 3/06 |
| | | | 16/251 |
| 2015/0277506 A1* | 10/2015 | Cheah | G06F 1/1681 |
| | | | 361/679.27 |
| 2015/0361696 A1* | 12/2015 | Tazbaz | G06F 1/1681 |
| | | | 361/679.27 |
| 2015/0370287 A1* | 12/2015 | Ko | G06F 1/1681 |
| | | | 361/749 |
| 2016/0132075 A1* | 5/2016 | Tazbaz | H04M 1/0216 |
| | | | 361/679.27 |
| 2016/0132076 A1* | 5/2016 | Bitz | H04M 1/022 |
| | | | 361/679.27 |
| 2016/0187935 A1* | 6/2016 | Tazbaz | G06F 1/1616 |
| | | | 361/679.03 |
| 2016/0224072 A1* | 8/2016 | Huang | G06F 1/1616 |
| 2017/0038798 A1* | 2/2017 | Lee | G06F 1/1616 |
| 2019/0302850 A1* | 10/2019 | Park | H04M 1/0216 |

FOREIGN PATENT DOCUMENTS

| | | |
|---|---|---|
| KR | 10-1180416 B1 | 9/2012 |
| KR | 10-2016-0083608 A | 7/2016 |
| KR | 10-2017-0018909 A | 2/2017 |

* cited by examiner

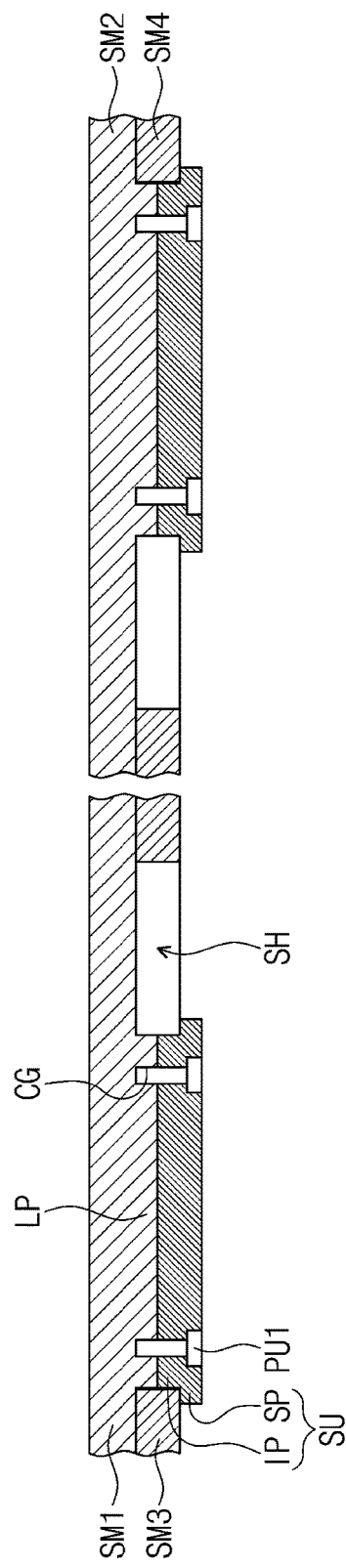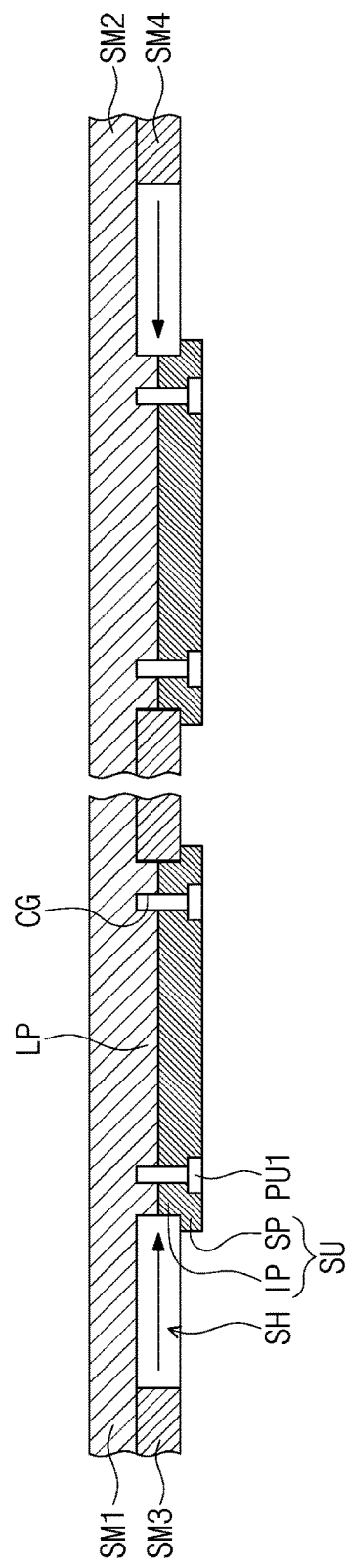

DISPLAY APPARATUS

CROSS-REFERENCE TO RELATED APPLICATIONS

This application is a continuation of U.S. patent application Ser. No. 16/171,138, filed on Oct. 25, 2018, which is a continuation of U.S. patent application Ser. No. 15/868,785 filed on Jan. 11, 2018, now U.S. Pat. No. 10,143,098, issued on Nov. 27, 2018, which claims priority to and the benefit of Korean Patent Application No. 10-2017-0096505, filed on Jul. 28, 2017 in the Korean Intellectual Property Office, the entire content of each of which is herein incorporated by reference.

BACKGROUND

1. Field

Aspects of embodiments of the present invention relate to a display apparatus.

2. Description of the Related Art

Display apparatuses for displaying images are included in electronic products for providing images to users, such as smartphones, digital cameras, notebook computers, navigation systems, and smart televisions, for example. Display apparatuses generate images and provide the generated images to users through display screens.

Display apparatuses having various shapes have been developed with the development of techniques. For example, flexible display apparatuses capable of being curved, folded, and/or rolled have been developed. The flexible display apparatuses of which shapes can be variously modified may be easily portable and may improve convenience of users.

SUMMARY

According to an aspect of embodiments of the present invention, a display apparatus, such as a foldable display apparatus, may have reduced deformation of a folding area by relaxing or reducing stress of the folding area of a display module.

According to an aspect of one or more embodiments of the present invention, a display apparatus includes: a first support member and a second support member arranged in a first direction; a plurality of joint units arranged in the first direction, extending in a second direction crossing the first direction, arranged between the first and second support members so as to be connected to the first and second support members, and coupled to be rotatable with respect to each other; a display module on the first and second support members and having flexibility; a third support member under the first support member; a fourth support member under the second support member; and a hinge member respectively providing a first rotation axis and a second rotation axis, which extend in the second direction, to one side of the third support member and one side of the fourth support member facing each other. The joint units are arranged along at least one curved trajectory when the third and fourth support members rotate on the first and second rotation axes, respectively. The at least one curved trajectory is defined as a partial curved line of a reference circle, and a central point of the reference circle is spaced apart from the first and second rotation axes.

According to another aspect of one or more embodiments, a display apparatus includes: a first support member and a second support member arranged in a first direction; a plurality of joint units arranged in the first direction, extending in a second direction crossing the first direction, arranged between the first and second support members so as to be connected to the first and second support members, and coupled to be rotatable with respect to each other; a display module on the first and second support members and having flexibility; a third support member under the first support member; a fourth support member under the second support member; and a hinge member respectively providing a first rotation axis and a second rotation axis, which extend in the second direction, to one side of the third support member and one side of the fourth support member facing each other. The joint units include: a plurality of first joint units coupled to be rotatable with respect to each other; a plurality of second joint units coupled to be rotatable with respect to each other; and a third joint unit arranged between the plurality of first joint units and the plurality of second joint units and coupled to a first joint unit of the plurality of first joint units and a second joint unit of the plurality of second joint units adjacent thereto to be rotatable with respect to each other. Each of the first, second, and third joint units includes an extension extending in the second direction, and a plurality of protrusions arranged at both sides of the extension and protruding in the first direction. Protrusions, arranged at each of the both sides of each of the extensions, of the protrusions protrude in opposite directions to each other when viewed in the second direction. Protrusions, arranged at each of the both sides of each of the extensions of the first and second joint units, of the protrusions do not overlap with each other and are alternately arranged when viewed in the first direction. Protrusions of joint units, adjacent to each other, of the first, second, and third joint units overlap with each other and are coupled to be rotatable with respect to each other.

BRIEF DESCRIPTION OF THE DRAWINGS

The above and other aspects and features of the present invention will become more apparent by describing in further detail some exemplary embodiments thereof with reference to the accompanying drawings, in which:

FIG. 28 is a view illustrating positions of the sliding units when the display apparatus is stretched out like illustrated in FIG. 25.

FIG. 29 is a view illustrating positions of the sliding units when the display apparatus is folded like illustrated in FIG. 27.

DETAILED DESCRIPTION

Figure 1:
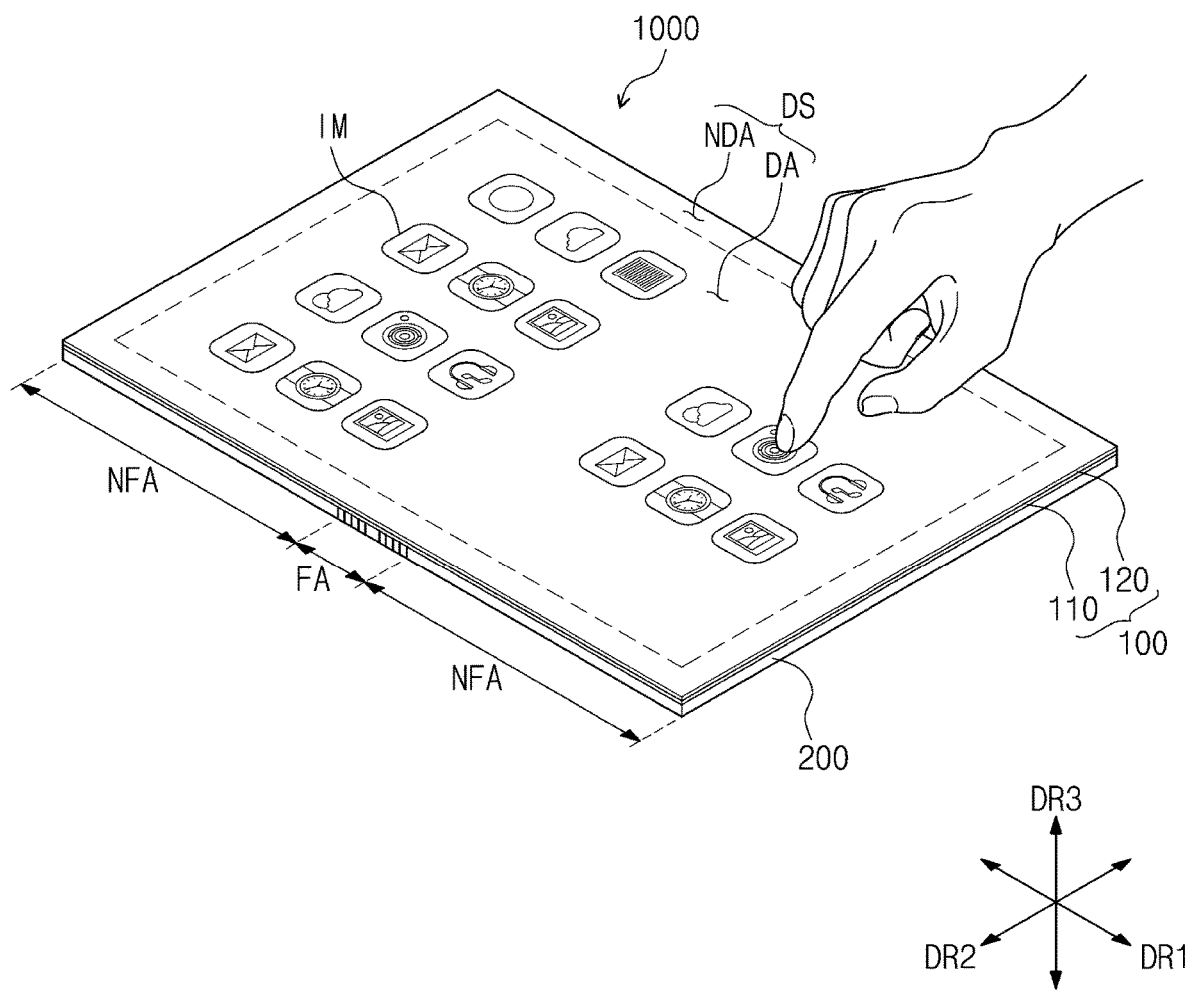
FIG. 1 is a perspective view illustrating a display apparatus according to an embodiment of the invention.

The invention now will be described more fully herein with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It is to be understood that when an element, such as a layer, region, or substrate is referred to as being "on" another element, it can be directly on the other element or one or more intervening elements may be present. In contrast, the term "directly" means that there are no intervening elements. As used herein, the term "and/or" includes any and all combinations of one or more of the associated listed items. The terminology used herein is for the purpose of describing particular embodiments and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It is to be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

It is to be understood that, although the terms "first," "second," etc. may be used herein to describe various elements, components, regions, layers, and/or sections, these elements, components, regions, layers, and/or sections are not limited by these terms. Rather, these terms are used to distinguish one element, component, region, layer, or section from another element, component, region, layer, or section. Thus, a "first" element, component, region, layer, or section discussed below could be termed a "second" element, component, region, layer, or section without departing from the teachings herein. "About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system).

Exemplary embodiments are described herein with reference to cross-sectional illustrations and/or plane illustrations that may be idealized exemplary illustrations. In the drawings, the thicknesses of layers and regions may be exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein, but are to include deviations in shapes that result, for example, from manufacturing. For example, an etching region illustrated as a rectangle may typically have rounded or curved features. Thus, the regions illustrated in the figures may be schematic in nature and their shapes are not intended to necessarily illustrate the actual shape of a region of a device and are not intended to limit the scope of exemplary embodiments.

Herein, some exemplary embodiments of the invention will be described in further detail with reference to the accompanying drawings.

Figure 2:
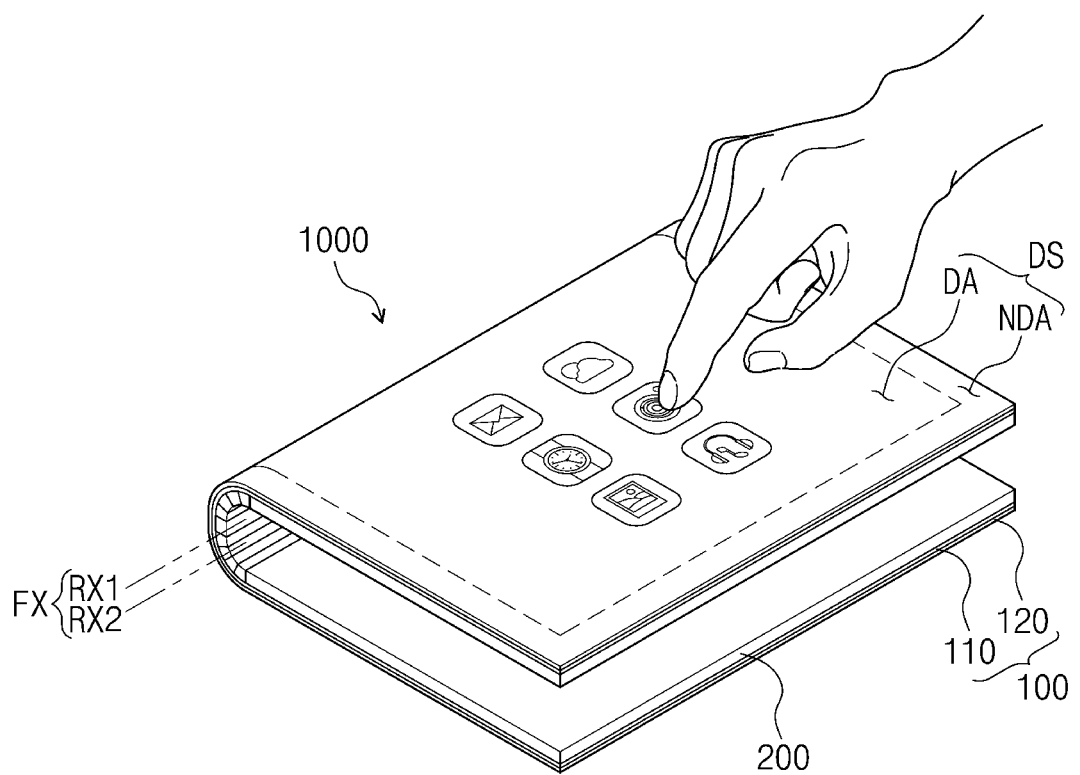
FIG. 2 is a perspective view illustrating the display apparatus of FIG. 1, shown in an out-folded state.

FIG. 1 is a perspective view illustrating a display apparatus according to an embodiment of the invention; and FIG. 2 is a perspective view illustrating the display apparatus of FIG. 1, shown in an out-folded state.

Referring to FIGS. 1 and 2, a display apparatus 1000 according to an embodiment of the invention may have a rectangular shape that has long sides parallel to a first direction DR1 and short sides parallel to a second direction DR2 intersecting or crossing the first direction DR1. However, embodiments of the invention are not limited thereto. In certain embodiments, the shape of the display apparatus 1000 may be variously modified. The display apparatus 1000 may be a flexible display apparatus and may be a folding or foldable display apparatus that may be folded or unfolded on a folding axis FX extending in the second direction DR2.

The display apparatus 1000 may be divided into a plurality of areas by the folding of the display apparatus 1000. For example, the display apparatus 1000 may include a folding area FA that is foldable, and two non-folding areas NFA that may be flat. The non-folding areas NFA are arranged in the first direction DR1 and the folding area FA is disposed between the two non-folding areas NFA. In the present embodiment, a single folding area FA is shown in the display apparatus 1000. However, embodiments of the invention are not limited thereto. In certain embodiments, a plurality of folding areas may be defined in the display apparatus 1000.

The folding axis FX includes a first rotation axis RX1 and a second rotation axis RX2 to provide biaxial rotation to the display apparatus 1000. The first rotation axis RX1 and the second rotation axis RX2 extend in the second direction DR2 and are disposed adjacent to each other. The folding area FA overlaps with the first and second rotation axes RX1 and RX2, and the display apparatus 1000 may be folded on the first rotation axis RX1 and the second rotation axis RX2.

The display apparatus 1000 includes a display module 100 and a support member 200 disposed under the display module 100. A top surface of the display module 100 may be defined as a display surface DS and may be a flat surface parallel to the first direction DR1 and the second direction DR2. Images IM generated by the display module 100 may be provided to a user through the display surface DS.

The display surface DS includes a display area DA and a non-display area NDA around the display area DA. The display area DA may display an image but the non-display area NDA may not display an image. In an embodiment, the non-display area NDA may surround the display area DA in a plan view and may correspond to a border portion of the display apparatus 1000, which may be printed with a color (e.g., a predetermined color).

In an embodiment, the display module 100 has flexibility and includes a display panel 110 and a touch sensing unit 120 disposed on the display panel 110. The display panel 110 may generate an image and may provide the generated image to a user. The display panel 110 may be a liquid crystal display panel, an organic light-emitting display panel, an electrophoretic display panel, an electrowetting display panel, or any of other various display panels capable of displaying images.

The touch sensing unit 120 may sense an external input (e.g., a hand or finger of a user, or a touch pen) to convert the external input into an input signal and may provide the input signal to the display panel 110. The touch sensing unit 120 may include a plurality of touch sensor parts (not shown) for sensing the external input. In an embodiment, the touch sensor parts may sense the external input by a capacitive method. The display panel 110 may receive the input signal from the touch sensing unit 120 and may generate an image corresponding to the input signal.

The support member 200 may support the display module 100 and may rotate on the first and second rotation axes RX1 and RX2 so as to be folded. Since the support member 200 is folded, the display module 100 having the flexibility may be folded by the support member 200. When the display apparatus 1000 is folded, the support member 200 may out-fold the display apparatus 1000 such that the display surface DS of the display module 100 is exposed outward.

Components of the support member 200 will be described later in further detail with reference to FIGS. 5 and 6. Herein, a direction intersecting a plane parallel to the first and second directions DR1 and DR2 is defined as a third direction DR3. The third direction DR3 may include an upper direction and a lower direction opposite to the upper direction.

Figure 3:
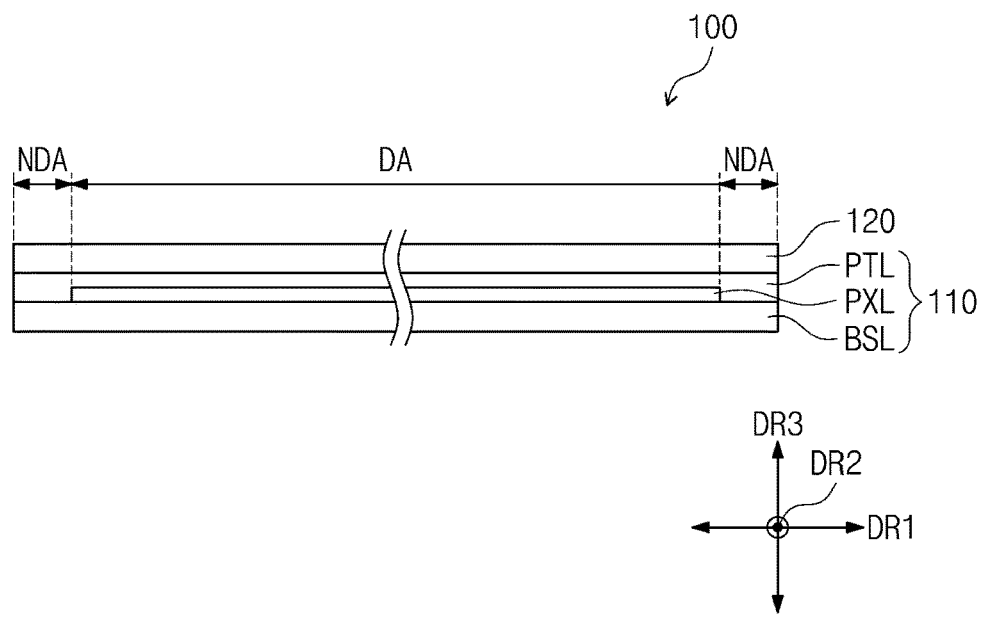
FIG. 3 is a cross-sectional view illustrating a display module of the display apparatus of FIG. 1.

FIG. 3 is a cross-sectional view illustrating the display module 100.

Referring to FIG. 3, the display panel 110 includes a base layer BSL, a pixel layer PXL disposed on the base layer BSL, and a protective layer PTL disposed on the base layer BSL to cover the pixel layer PXL.

The base layer BSL may define a back surface of the display module 100 and may have flexibility. The pixel layer PXL may include a plurality of pixels (not shown) and may be driven by applied electrical signals to generate images IM. The protective layer PTL may protect the pixel layer PXL, and the touch sensing unit 120 may be disposed on the protective layer PTL. In an embodiment, the protective layer PTL may have a multi-layered structure and may include an organic insulating layer and/or an inorganic insulating layer.

Figure 4:
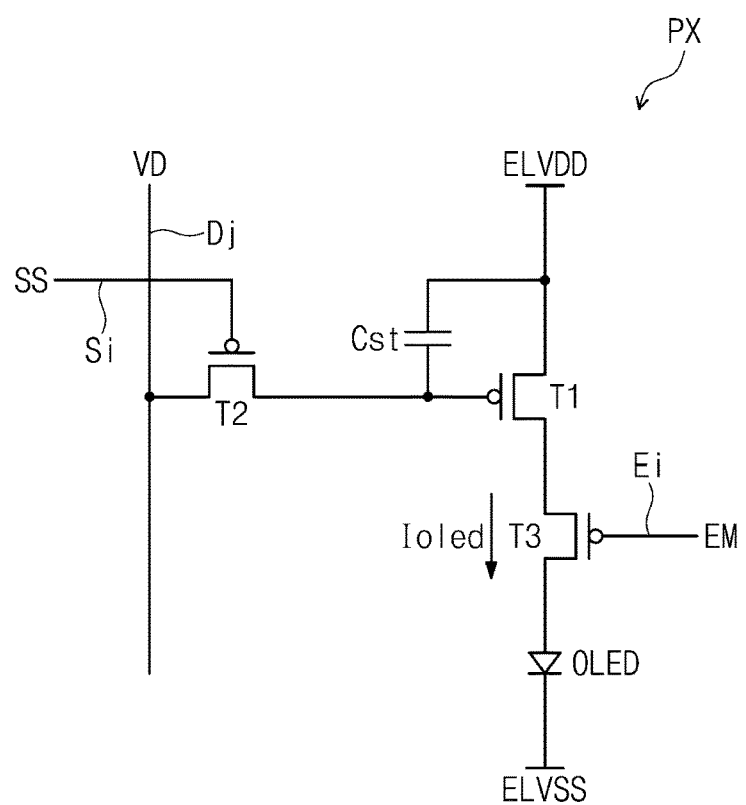
FIG. 4 is an equivalent circuit diagram of one of pixels disposed in a pixel layer illustrated in FIG. 3.

FIG. 4 is an equivalent circuit diagram of one of pixels disposed in the pixel layer PXL illustrated in FIG. 3.

Components of one pixel PX are illustrated as an example in FIG. 4. Each of other pixels may have the same components as the pixel PX illustrated in FIG. 4. In an embodiment of the invention, the pixel PX of FIG. 4 may be an organic light-emitting pixel used in an organic light-emitting display panel.

Referring to FIG. 4, the pixel PX is connected to a scan line Si, a data line Dj, and a light-emitting line Ei. Here, "i" and "j" are natural numbers. The pixel PX includes a light-emitting element OLED, a driving transistor T1, a capacitive element Cst, a switching transistor T2, and a light-emitting control transistor T3. The light-emitting element OLED may be an organic light-emitting diode.

A source terminal of the driving transistor T1 is provided with a first voltage ELVDD, and a drain terminal of the driving transistor T1 is connected to a source terminal of the light-emitting control transistor T3. A gate terminal of the driving transistor T1 is connected to a drain terminal of the switching transistor T2.

A gate terminal of the switching transistor T2 is connected to the scan line Si, and a source terminal of the switching transistor T2 is connected to the data line Dj. A first electrode of the capacitive element Cst is connected to the source terminal of the driving transistor T1, and a second electrode of the capacitive element Cst is connected to the gate terminal of the driving transistor T1.

A gate terminal of the light-emitting control transistor T3 is connected to the light-emitting line Ei, and a drain terminal of the light-emitting control transistor T3 is connected to an anode electrode of the light-emitting element OLED. A cathode electrode of the light-emitting element OLED receives a second voltage ELVSS. A level of the second voltage ELVSS may be lower than a level of the first voltage ELVDD.

The switching transistor T2 is turned-on in response to a scan signal SS provided through the scan line Si. The turned-on switching transistor T2 provides a data voltage VD received through the data line Dj to the gate terminal of the driving transistor T1. The capacitive element Cst stores the data voltage VD applied to the gate terminal of the driving transistor T1 and retains the stored data voltage VD after the switching transistor T2 is turned-off.

The gate terminal of the light-emitting control transistor T3 receives a light-emitting signal EM through the light-emitting line Ei, and, thus, the light-emitting control transistor T3 is turned-on. The turned-on light-emitting control transistor T3 provides a current Ioled flowing through the driving transistor T1 to the light-emitting element OLED (e.g., the organic light-emitting diode). The pixel PX may emit light while the light-emitting signal EM is applied, and an intensity of the light emitted from the light-emitting element OLED may be changed depending on the amount of the current Ioled provided to the light-emitting element OLED.

In FIG. 4, in an embodiment, the transistors T1 to T3 of the pixel PX are PMOS transistors. However, embodiments of the invention are not limited thereto. In another embodiment, the transistors T1 to T3 of the pixel PX may be NMOS transistors.

Figure 5:
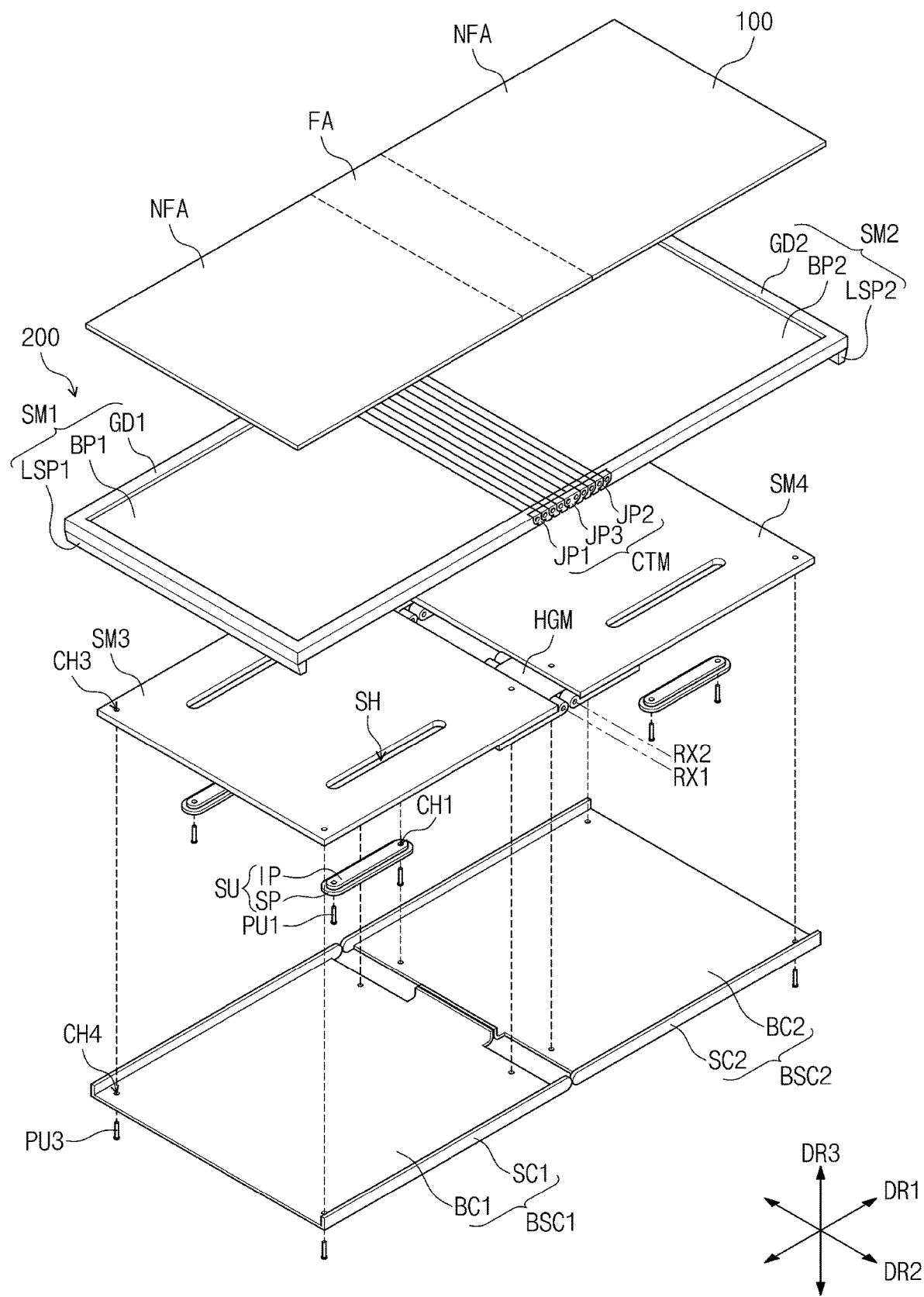
FIGS. 5 and 6 are exploded perspective views illustrating a support member of the display apparatus of FIG. 1.
Figure 6:
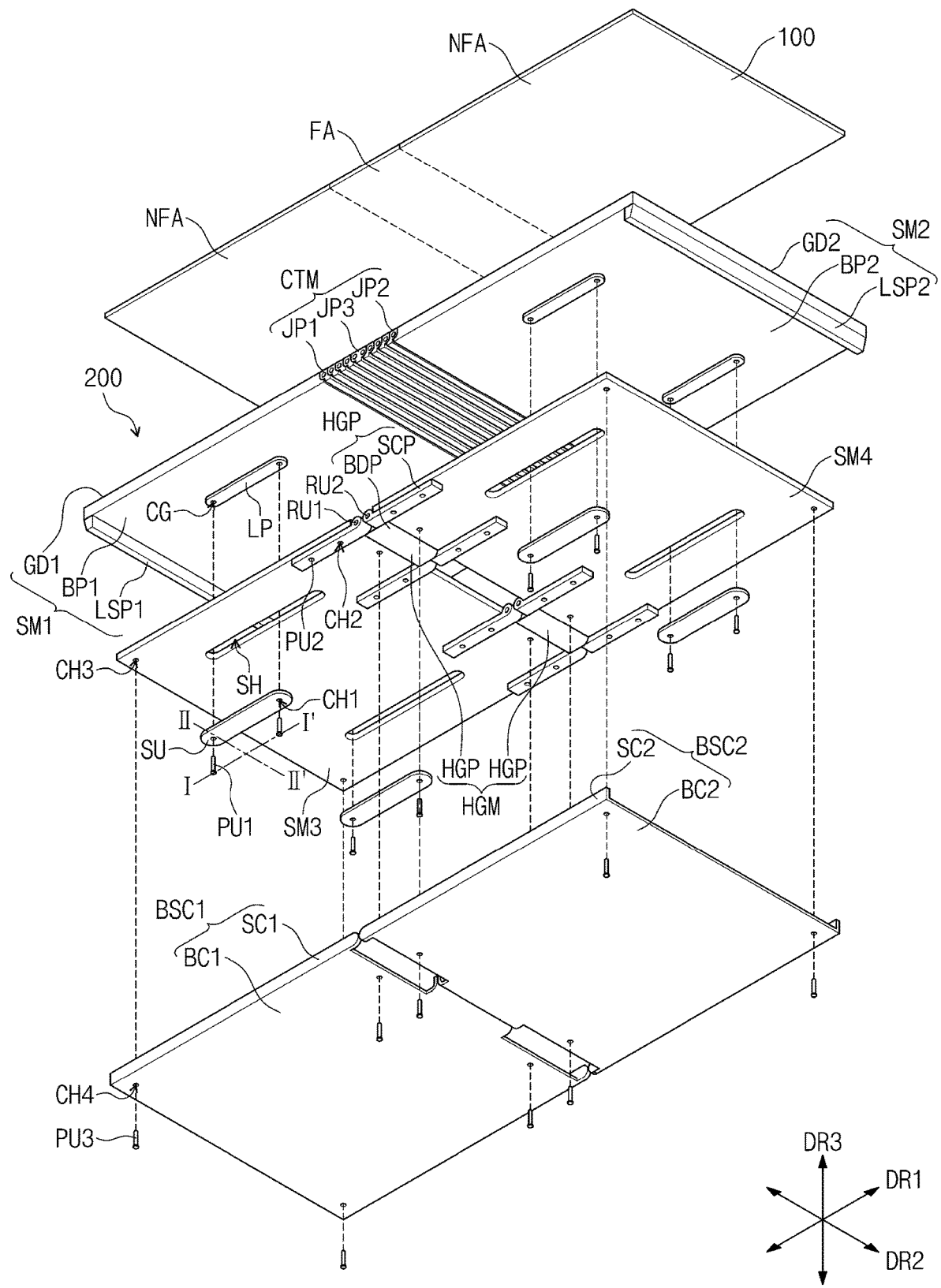

FIGS. 5 and 6 are exploded perspective views illustrating a support member of FIG. 1.

FIG. 5 is an exploded perspective view showing an upper portion of the support member 200; and FIG. 6 is an exploded perspective view showing a lower portion of the support member 200.

Referring to FIGS. 5 and 6, in an embodiment, the support member 200 includes a first support member SM1, a second support member SM2, a third support member SM3, a fourth support member SM4, a connection member CTM, a hinge member HGM, a plurality of sliding units SU, a first back surface cover BSC1, and a second back surface cover BSC2.

The first and second support members SM1 and SM2 may be arranged in the first direction DR1, and the display module 100 is disposed on the first and second support members SM1 and SM2. The connection member CTM is disposed between the first support member SM1 and the second support member SM2 so as to be connected between one side of the first support member SM1 and one side of the second support member SM2, which face each other in the first direction DR1.

The first support member SM1 includes a first bottom part BP1, a first guide part GD1 protruding upward from sides of the first bottom part BP1 except one side of the first bottom part BP1, and a first lower support part LSP1 protruding downward from another side of the first bottom part BP1 opposite to the one side of the first bottom part BP1.

The second support member SM2 includes a second bottom part BP2, a second guide part GD2 protruding upward from sides of the second bottom part BP2 except one side of the second bottom part BP2, and a second lower support part LSP2 protruding downward from another side of the second bottom part BP2 opposite to the one side of the second bottom part BP2.

The one side of the first bottom part BP1 and the one side of the second bottom part BP2 face each other. The folding area FA of the display module 100 is disposed on the connection member CTM, and the non-folding areas NFA of the display module 100 are disposed on the first and second bottom parts BP1 and BP2, respectively.

The connection member CTM includes a plurality of joint units JP1, JP2, and JP3 arranged in the first direction DR1 and extending in the second direction DR2. The joint units JP1, JP2, and JP3 are connected to the first and second support members SM1 and SM2 and are coupled to each other to rotate with respect to each other.

The joint units JP1, JP2, and JP3 include a plurality of first joint units JP1, a plurality of second joint units JP2, and a third joint unit JP3. The third joint unit JP3 is disposed between the first joint units JP1 and the second joint units JP2. The first joint units JP1 are disposed between the third joint unit JP3 and the first support member SM1. The second joint units JP2 are disposed between the third joint unit JP3 and the second support member SM2.

The one side of the first support member SM1, the one side of the second support member SM2, and the first, second, and third joint units JP1, JP2, and JP3 are coupled to each other to rotate with respect to each other. The first, second, and third joint units JP1, JP2, and JP3 may be arranged along at least one curved trajectory when the display apparatus 1000 is folded. The first, second, and third joint units JP1, JP2, and JP3 will be described later in more detail with reference to FIGS. 12 to 24.

In the present specification, the term "a hole" is defined as a space that penetrates an object, and the term "a recess" is defined as a space that is recessed from a surface of an object by a predetermined depth.

The third and fourth support members SM3 and SM4 are arranged in the first direction DR1. The third support member SM3 is disposed under the first support member SM1, and the fourth support member SM4 is disposed under the second support member SM2. A plurality of sliding holes SH is defined in each of the third and fourth support members SM3 and SM4. The sliding holes SH extend in the first direction DR1. The sliding units SU are disposed to overlap with the sliding holes SH in one-to-one correspondence.

The sliding units SU may be connected to bottoms of the first and second support members SM1 and SM2 through the sliding holes SH. In more detail, each of the sliding units SU includes an insertion part IP extending in the first direction DR1 and inserted in a corresponding one of the sliding holes SH, and a support part SP connected to a bottom of the insertion part IP. The insertion parts IP may be inserted in the sliding holes SH so as to be connected to the bottoms of the first and second support members SM1 and SM2.

A size of the support part SP of each of the sliding units SU is greater than a size of the insertion part IP of each of the sliding units SU when viewed in the third direction DR3.

A width of each of the support parts SP in the second direction DR2 is greater than a width of each of the sliding holes SH in the second direction DR2. A length of each of the insertion parts IP in the first direction DR1 is shorter than a length of each of the sliding holes SH in the first direction DR1.

Lower protrusions LP are disposed on the bottom of each of the first and second support members SM1 and SM2. The lower protrusions LP protrude from the bottom of each of the first and second support members SM1 and SM2 in the lower direction. The insertion parts IP are connected to the lower protrusions LP in one-to-one correspondence. A size of each of the insertion parts IP may be equal to a size of each of the lower protrusions LP when viewed in the third direction DR3. A length of each of the lower protrusions LP in the first direction DR1 is shorter than the length of each of the sliding holes SH in the first direction DR1.

A plurality of first connection holes CH1 may be defined in each of the sliding units SU, and a plurality of connection recesses CG may be defined in each of the lower protrusions LP. The insertion parts IP and the lower protrusions LP are inserted in the sliding holes SH, and the first connection holes CH1 are disposed to overlap with the connection recesses CG in one-to-one correspondence. A plurality of first pin units PU1 may be inserted in the first connection holes CH1 and the connection recesses CG to connect the insertion parts IP to the lower protrusions LP. As a result, the sliding units SU may be connected to the bottoms of the first and second support members SM1 and SM2.

Four sliding units SU, four lower protrusions LP, and four sliding holes SH are illustrated as an example in FIGS. 5 and 6. However, the number of the sliding units SU, the number of the lower protrusions LP, and the number of the sliding holes SH are not limited thereto.

The hinge member HGM overlaps with the connection member CTM and is disposed between the third support member SM3 and the fourth support member SM4. The hinge member HGM is connected to one side of the third support member SM3 and one side of the fourth support member SM4, which face each other in the first direction DR1. The hinge member HGM provides rotation axes RX1 and RX2 to the one side of the third support member SM3 and the one side of the fourth support member SM4, respectively. The rotation axes RX1 and RX2 include a first rotation axis RX1 provided to the one side of the third support member SM3, and a second rotation axis RX2 provided to the one side of the fourth support member SM4.

In an embodiment, the hinge member HGM includes a plurality of hinge parts HGP arranged in the second direction DR2 and disposed between the third support member SM3 and the fourth support member SM4. For example, the hinge member HGM is shown including two hinge parts HGP in FIGS. 5 and 6. However, the number of the hinge parts HGP is not limited thereto. In other words, the hinge member HGM may include one hinge part HGP or may include three or more hinge parts HGP.

Each of the hinge parts HGP is connected to the one side of the third support member SM3 and the one side of the fourth support member SM4 to provide the first rotation axis RX1 and the second rotation axis RX2 to the one side of the third support member SM3 and the one side of the fourth support member SM4, respectively. Each of the hinge parts HGP includes a body part BDP extending in the second direction DR2, and a plurality of sub-connection parts SCP disposed at each of both sides of the body part BDP. The both sides of the body part BDP are defined as sides of the body part BDP which are opposite to each other in the second direction DR2.

Each of the body parts BDP includes a first rotation unit RU1 providing the first rotation axis RX1 and a second rotation unit RU2 providing the second rotation axis RX2. The first rotation unit RU1 extends in the second direction DR2 and rotates on the first rotation axis RX1, and the second rotation unit RU2 extends in the second direction DR2 and rotates on the second rotation axis RX2. Shapes of the first and second rotation units RU1 and RU2 will be described later in more detail with reference to FIG. 9.

The sub-connection parts SCP are connected to the first and second rotation units RU1 and RU2, respectively. In more detail, two sub-connection parts SCP may be disposed at each of the both sides of each of the body parts BDP. One end portion of one of the two sub-connection parts SCP may be connected to the first rotation unit RU1, and one end portion of the other of the two sub-connection parts SCP may be connected to the second rotation unit RU2. The one end portion of the one sub-connection part SCP and the one end portion of the other sub-connection part SCP face each other in the first direction DR1.

The sub-connection parts SCP extend in the first direction DR1 so as to be connected to a bottom of the third support member SM3 adjacent to the one side of the third support member SM3 and a bottom of the fourth support member SM4 adjacent to the one side of the fourth support member SM4, respectively. For example, a plurality of second pin units PU2 may be inserted in a plurality of second connection holes CH2 defined in the sub-connection parts SCP and may be connected to the bottom of the third support member SM3 and the bottom of the fourth support member SM4.

The first back surface cover BSC1 is disposed under the third support member SM3, and the second back surface cover BSC2 is disposed under the fourth support member SM4. The first and second back surface covers BSC1 and BSC2 are connected to the bottoms of the third and fourth support members SM3 and SM4 to cover the sliding units SU.

A plurality of third connection holes CH3 may be defined in each of the third and fourth support members SM3 and SM4, and a plurality of fourth connection holes CH4 may be defined in each of the first and second back surface covers BSC1 and BSC2. The third connection holes CH3 are disposed adjacent to both sides, opposite to each other in the first direction DR1, of the third support member SM3 and are disposed adjacent to both sides, opposite to each other in the first direction DR1, of the fourth support member SM4.

The fourth connection holes CH4 are disposed to overlap with the third connection holes CH3 in one-to-one correspondence. A plurality of third pin units PU3 may be inserted in the fourth connection holes CH4 and the third connection holes CH3 to connect the first and second back surface covers BSC1 and BSC2 to the third and fourth support members SM3 and SM4, respectively.

The first back surface cover BSC1 includes a first bottom cover BC1 and a pair of first sidewall covers SC1 extending upward from both sides, opposite to each other in the second direction DR2, of the first bottom cover BC1. A length of each of the first sidewall covers SC1 in the first direction DR1 may be longer than a length of the first bottom cover BC1 in the first direction DR1.

The second back surface cover BSC2 and the first back surface cover BSC1 have symmetrical structures. The second back surface cover BSC2 includes a second bottom cover BC2 having a structure symmetrical to that of the first bottom cover BC1, and second sidewall covers SC2 having structures symmetrical to those of the first sidewall covers SC1.

The fourth connection holes CH4 are defined in the first and second bottom covers BC1 and BC2. The first and second sidewall covers SC1 and SC2 may cover both sides, opposite to each other in the second direction DR2, of the third support member SM3 and both sides, opposite to each other in the second direction DR2, of the fourth support member SM4, respectively. In addition, the first and second sidewall covers SC1 and SC2 may cover the sub-connection parts SCP such that the sub-connection parts SCP are not exposed when viewed in the second direction DR2.

Figure 7:
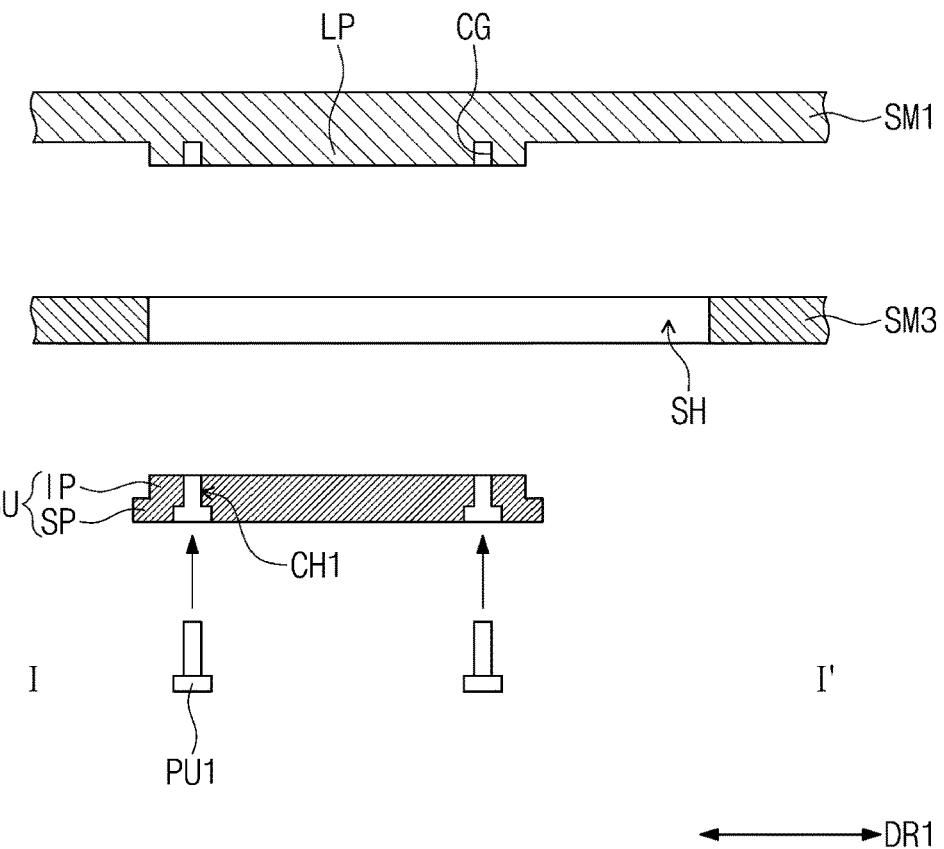
FIG. 7 is a cross-sectional view illustrating a first support member, a third support member, and a sliding unit of the support member of FIG. 6, taken along the line I-I'.
Figure 8:
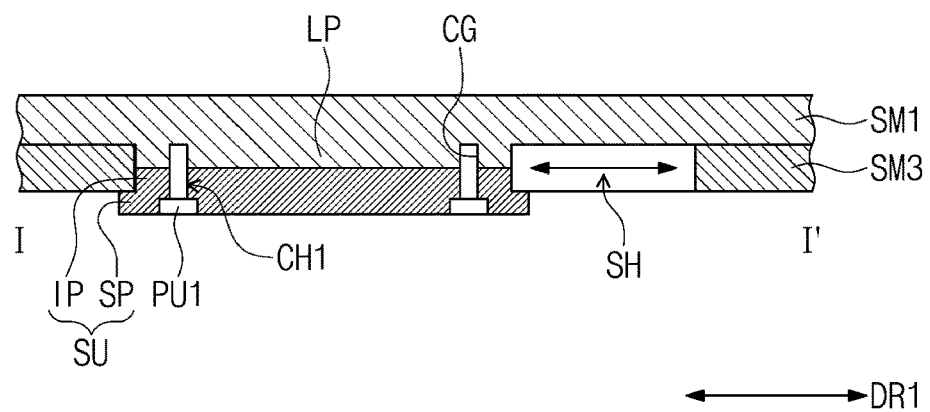
FIG. 8 is a cross-sectional view illustrating the first support member and the sliding unit of FIG. 7, shown connected to each other.
Figure 9:
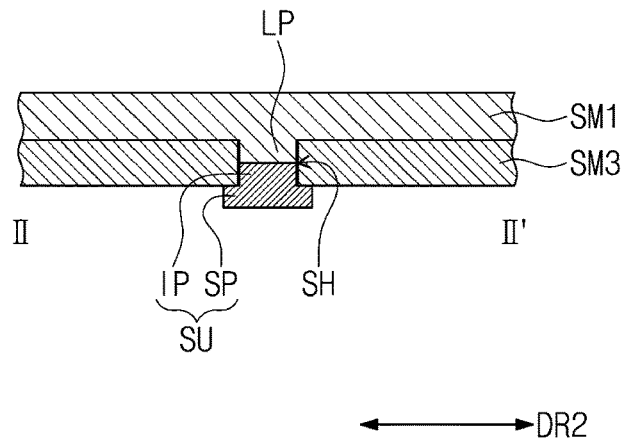
FIG. 9 is a cross-sectional view taken along the line II-II' of FIG. 6 illustrating the first support member and the sliding unit of FIG. 7, shown connected to each other.

FIG. 7 is a cross-sectional view illustrating the first support member SM1, the third support member SM3, and one sliding unit SU, taken along the line I-I' of FIG. 6. FIG. 8 is a cross-sectional view illustrating the first support member SM1 and the sliding unit SU, shown connected to each other. FIG. 9 is a cross-sectional view taken along the line II-II' of FIG. 6 illustrating the first support member SM1 and the sliding unit SU, shown connected to each other.

In FIGS. 7, 8, and 9, the first support member SM1, the third support member SM3, and one sliding unit SU are illustrated to explain a connection state of the first support member SM1 and the sliding unit SU.

Referring to FIGS. 7, 8, and 9, the insertion part IP and the lower protrusion LP are inserted in the sliding hole SH, and the first connection holes CH1 are disposed to overlap with the connection recesses CG, respectively. The first pin units PU1 are inserted in the first connection holes CH1 and the connection recesses CG, and, thus, the insertion part IP and the lower protrusion LP are connected to each other.

Since the width of the support part SP in the second direction DR2 is greater than the width of the sliding hole SH in the second direction DR2, the support part SP is not inserted in the sliding hole SH. The support part SP may be disposed to be in contact with a bottom surface of the third support member SM3 adjacent to the sliding hole SH.

The length of the lower protrusion LP in the first direction DR1 is shorter than the length of the sliding hole SH in the first direction DR1, and the length of the insertion part IP in the first direction DR1 is shorter than the length of the sliding hole SH in the first direction DR1. Thus, when the insertion part IP is connected to the lower protrusion LP, the insertion part IP and the lower protrusion LP may reciprocate in the first direction DR1 in the sliding hole SH. As a result, the first support member SM1 may reciprocate in the first direction DR1 along the sliding hole SH.

The connection structure of one lower protrusion LP and one sliding unit SU is described as an example. However, other lower protrusions LP and other sliding units SU may be connected to each other by the same structure and method as described above.

Figure 10:
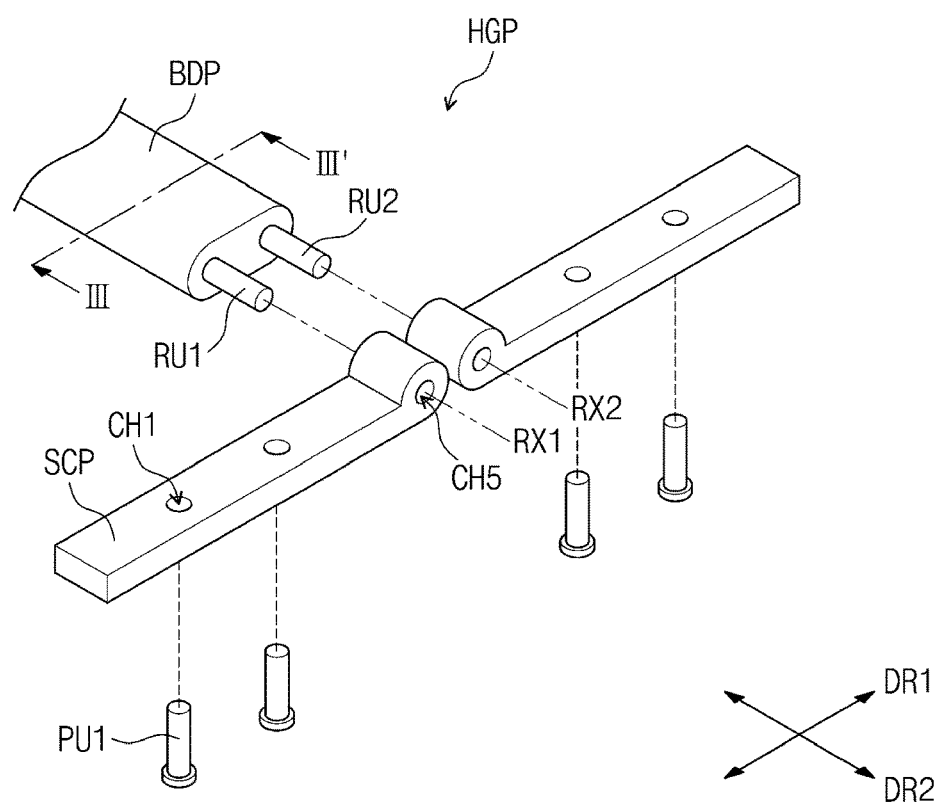
FIG. 10 is a perspective view illustrating a portion of a body part of one hinge part of the support member of FIGS. 5 and 6 and sub-connection parts disposed at one side of the one hinge part.
Figure 11:
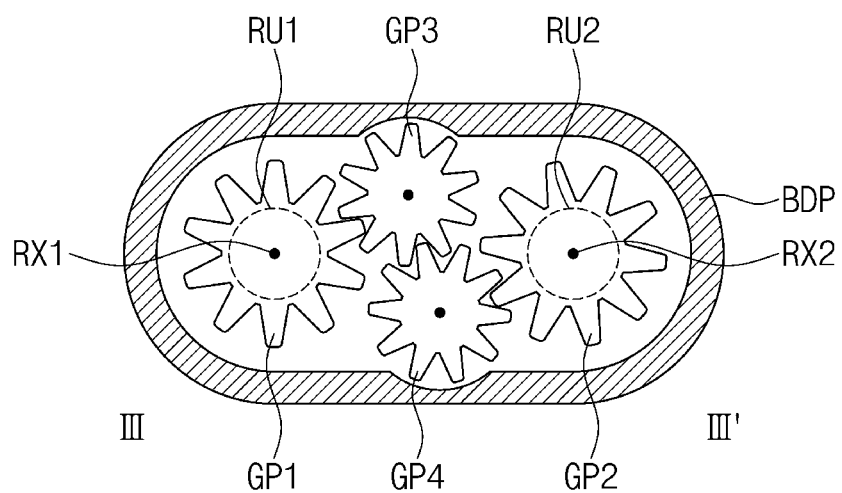
FIG. 11 is a cross-sectional view taken along a line III-III' of FIG. 10.

FIG. 10 is a perspective view illustrating a portion of the body part BDP of one hinge part HGP and sub-connection parts SCP disposed at one side of the one hinge part HGP. FIG. 11 is a cross-sectional view taken along a line III-III' of FIG. 10.

Referring to FIGS. 10 and 11, the first rotation unit RU1 and the second rotation unit RU2 may extend in the second direction DR2 and may rotate on the first rotation axis RX1 and the second rotation axis RX2, respectively. First, second, third, and fourth gear parts GP1, GP2, GP3, and GP4 are disposed in the body part BDP. The first gear part GP1 provides the first rotation axis RX1, and the second gear part GP2 provides the second rotation axis RX2. The third and fourth gear parts GP3 and GP4 are disposed between the first gear part GP1 and the second gear part GP2.

Even though the cross-section is illustrated in FIG. 11, the first, second, third, and fourth gear parts GP1, GP2, GP3, and GP4 extend in the second direction DR2 like the first and second rotation units RU1 and RU2. An outer circumferential surface of each of the first to fourth gear parts GP1 to GP4 may have a gear shape when viewed in the second direction DR2, and the first to fourth gear parts GP1 to GP4 may be engaged with each other.

The first gear part GP1 is disposed on the same line as the first rotation unit RU1 and is connected to the first rotation unit RU1. The first rotation axis RX1 may be substantially a central axis of the first rotation unit RU1 and the first gear part GP1, which extends in the second direction DR2. The second gear part GP2 is disposed on the same line as the second rotation unit RU2 and is connected to the second rotation unit RU2. The second rotation axis RX2 may be substantially a central axis of the second rotation unit RU2 and the second gear part GP2, which extends in the second direction DR2.

A fifth connection hole CH5 extending in the second direction DR2 is defined in the one end portion of each of the sub-connection parts SCP. The first and second rotation units RU1 and RU2 are inserted in the fifth connection holes CH5 of the sub-connection parts SCP, respectively, and, thus, the sub-connection parts SCP are connected to the first and second rotation units RU1 and RU2. The first rotation unit RU1 and the first gear part GP1 rotate on the first rotation axis RX1, and the second rotation unit RU2 and the second gear part GP2 rotate on the second rotation axis RX2.

Figure 12:
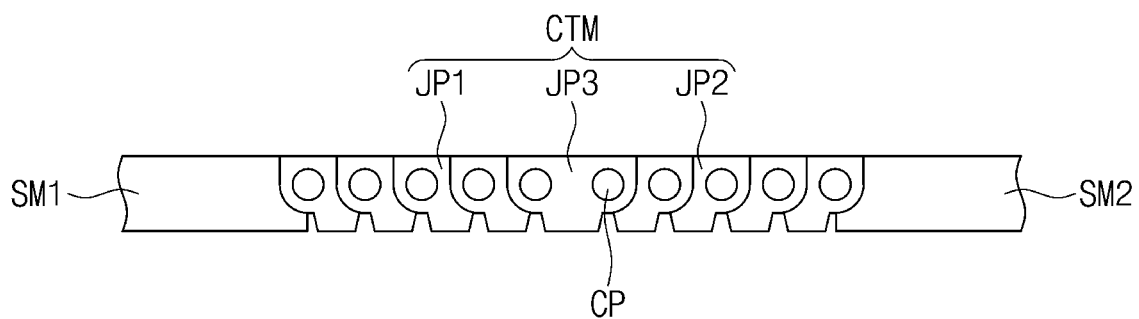
FIG. 12 is a side view illustrating joint units of the support member of FIGS. 5 and 6 when viewed in a second direction.
Figure 13:
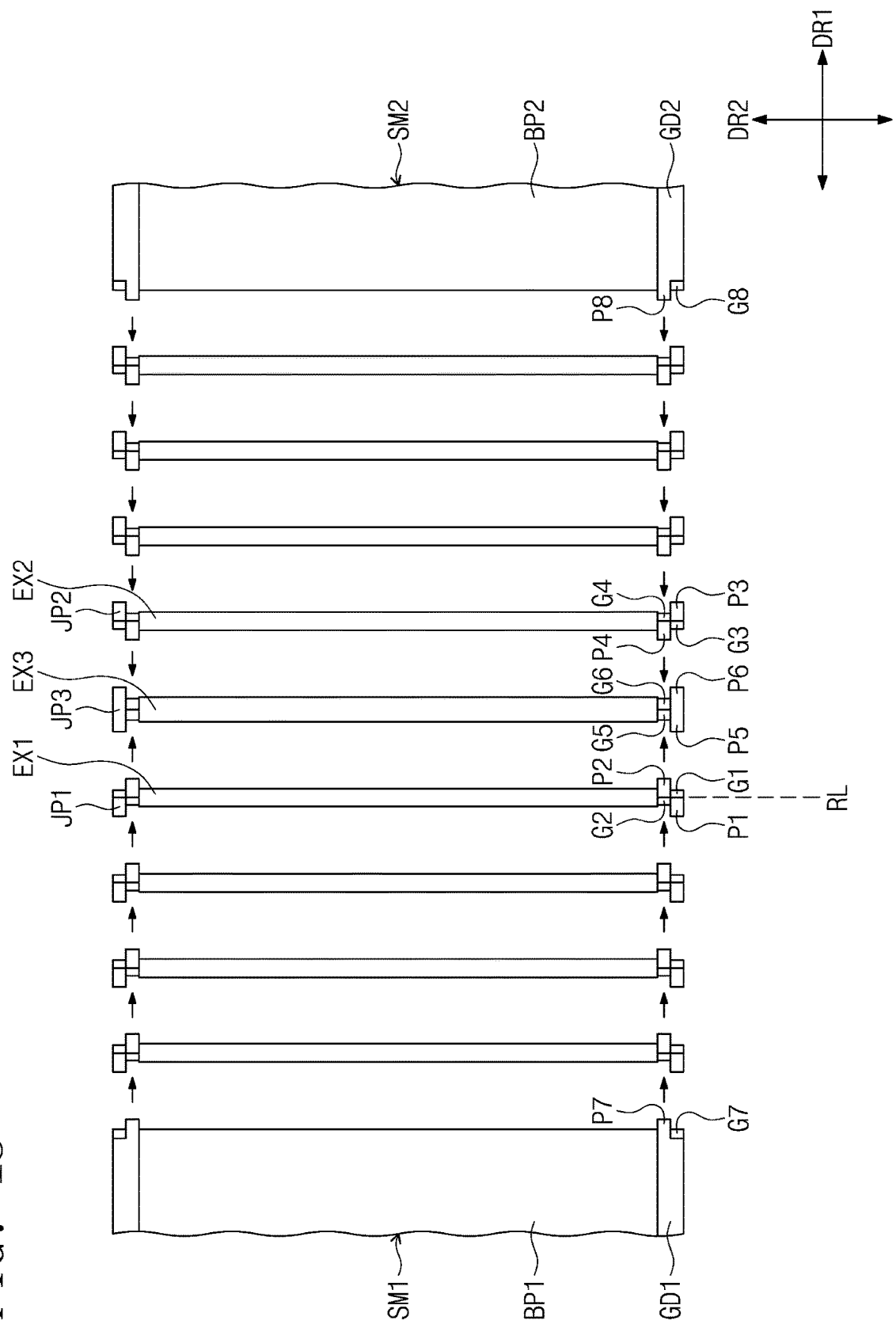
FIG. 13 is an exploded top view illustrating first joint units, second joint units, a third joint unit, and first and second support members.
Figure 14:
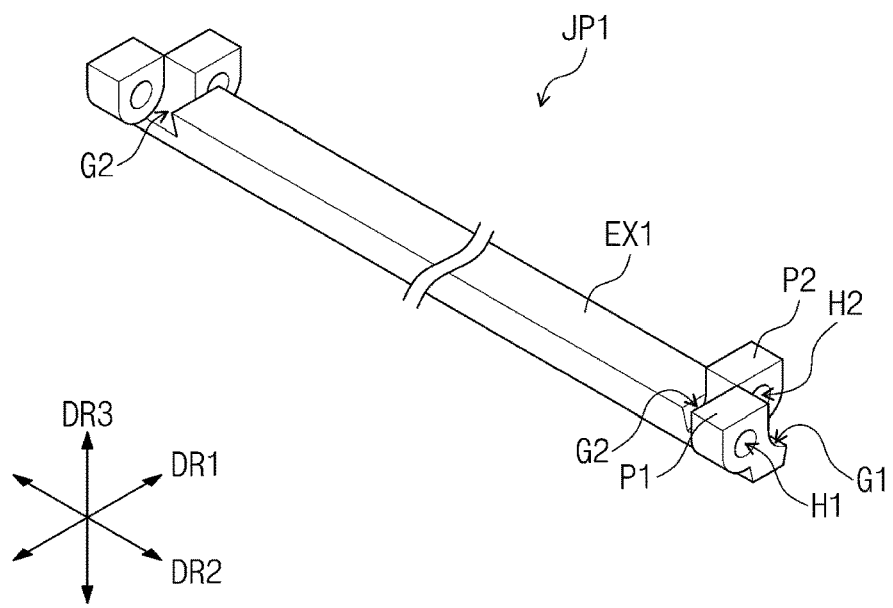
FIG. 14 is a perspective view illustrating one of the first joint units of FIG. 13.
Figure 15:
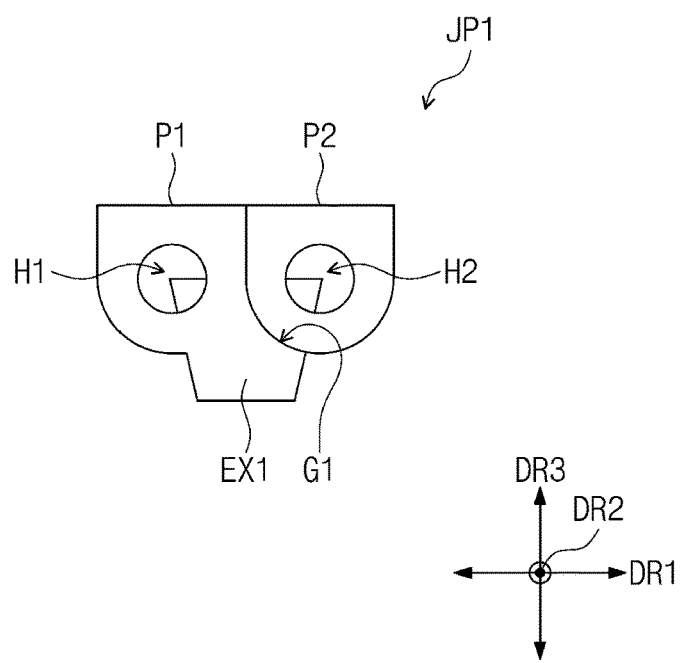
FIG. 15 is a side view illustrating the first joint unit of FIG. 14 when viewed in the second direction.
Figure 16:
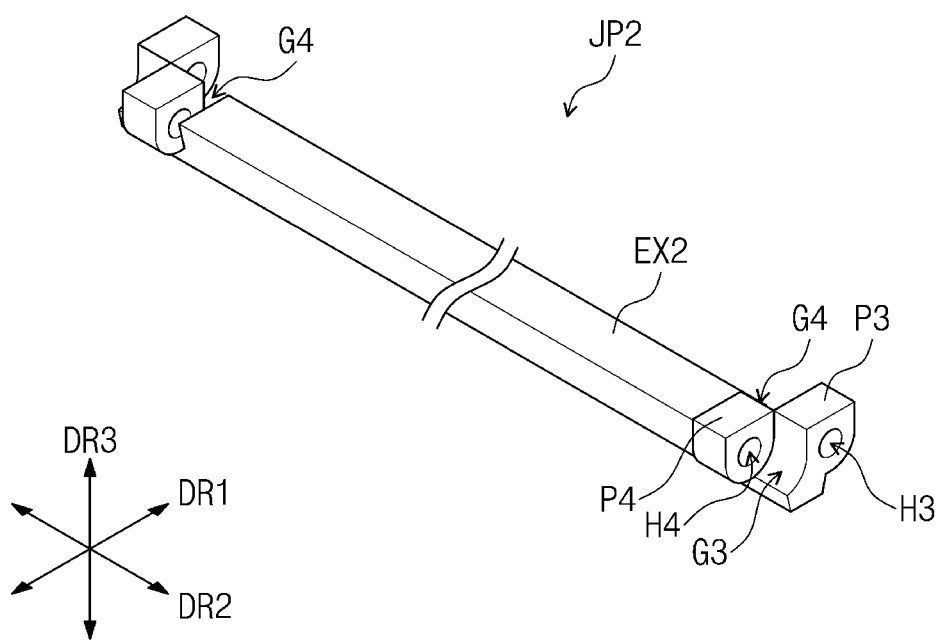
FIG. 16 is a perspective view illustrating one of the second joint units of FIG. 13.

FIG. 12 is a side view illustrating the joint units JP1, JP2, and JP3 when viewed in a second direction. FIG. 13 is an exploded top view illustrating first joint units JP1, second joint units JP2, a third joint unit JP3, and first and second support members SM1 and SM2. FIG. 14 is a perspective view illustrating one of the first joint units JP1; and FIG. 15 is a side view illustrating the first joint unit JP1 when viewed in the second direction. FIG. 16 is a perspective view illustrating one of the second joint units JP2.

Referring to FIGS. 12 and 13, the first, second and third joint units JP1, JP2, and JP3, the one side of the first support member SM1 and the first joint unit JP1 adjacent to the first support member SM1, and the one side of the second support member SM2 and the second joint unit JP2 adjacent to the second support member SM2 may be coupled to rotate with respect to each other.

The first, second and third joint units JP1, JP2, and JP3 include extensions EX1, EX2, and EX3 extending in the second direction DR2 and protrusions P1 to P6 protruding from both sides of the extensions EX1, EX2, and EX3 in the first direction D1. The protrusions P1 and P2, P3 and P4, or P5 and P6 disposed at each of the both sides of each of the extensions EX1, EX2, and EX3 may protrude in opposite directions to each other when viewed in the second direction DR2. The protrusions P1 and P2 or P3 and P4 disposed at each of the both sides of each of the extensions EX1 and EX2 of the first and second joint units JP1 and JP2 may not overlap with each other but may be alternately arranged when viewed in the first direction DR1. The protrusions P1 to P6 of adjacent joint units of the first, second, and third joint units JP1, JP2, and JP3 may overlap with each other and may be coupled to rotate with respect to each other.

Herein, structures of the protrusions P1 to P6 of the joint units JP1, JP2, and JP3 and the connection structure of the joint units JP1, JP2, and JP3 will be described in more detail.

In an embodiment, the number of the joint units JP1, JP2, and JP3 may be an odd number, the number of the first joint units JP1 may be an even number, and the number of the second joint units JP2 may be an even number. The first joint units JP1 and the second joint units JP2 may have structures symmetrical to each other.

The first, second, and third joint units JP1, JP2, and JP3 are coupled to each other by a plurality of coupling pins CP to rotate with respect to each other. The one side of the first support member SM1 and the first joint unit JP1 adjacent to the first support member SM1 are coupled by coupling pins CP to rotate with respect to each other. The one side of the second support member SM2 and the second joint unit JP2 adjacent to the second support member SM2 are coupled by coupling pins CP to rotate with respect to each other.

Referring to FIG. 13, each of the first joint units JP1 includes a first extension EX1, a plurality of first protrusions P1, and a plurality of second protrusions P2. A plurality of first recesses G1 and a plurality of second recesses G2 are defined in the first extension EX1 of each of the first joint units JP1.

The first extension EX1 extends in the second direction DR2 and has an inverted trapezoidal shape when viewed in the second direction DR2. Herein, the both sides of the first extension EX1 are defined as one side and another side of the first extension EX1, which are opposite to each other in the second direction DR2. The first direction DR1 may include a left direction and a right direction opposite to the left direction.

The first protrusions P1 protrude from the both sides of the first extension EX1 in the first direction DR1. The second protrusions P2 are disposed adjacent to the first protrusions P1, respectively, and protrude in the first direction DR1. The second protrusions P2 protrude in a direction opposite to the protruding direction of the first protrusions P1. For example, the first protrusions P1 may protrude in the left direction of the first direction DR1, and the second protrusions P2 may protrude in the right direction of the first direction DR1.

An imaginary line that extends in the second direction DR2 in a central portion of the first extension EX1 may be defined as a reference line RL. In each of the first joint units JP1, the first protrusions P1 may protrude from the reference line RL in the left direction of the first direction DR1, and the second protrusions P2 may protrude from the reference line RL in the right direction of the first direction DR1.

Referring to FIGS. 14 and 15, the first protrusion P1 and the second protrusion P2 disposed at each of the both sides of the first extension EX1 may have symmetrical shapes when viewed in the second direction DR2. The first and second protrusions P1 and P2 disposed at each of the both sides of the first extension EX1 may not overlap with each other but may be alternately arranged when viewed in the first direction DR1. The second protrusions P2 may be closer to a center of the first extension EX1 than the first protrusions P1 when viewed in the first direction DR1. However, embodiments of the invention are not limited thereto. In another embodiment, the first protrusions P1 may be closer to the center of the first extension EX1 than the second protrusions P2 when viewed in the first direction DR1.

One first protrusion P1 and one second protrusion P2 are shown alternately disposed at each of the both sides of the first extension EX1 in the drawings. However, embodiments of the invention are not limited thereto. In certain embodiments, a plurality of the first protrusions P1 and a plurality of the second protrusions P2 may be alternately arranged at each of the both sides of the first extension EX1.

The inverted trapezoidal shape of the first extension EX1 includes a top side parallel to the first direction DR1, a bottom side parallel to the first direction DR1 and shorter than the top side, and two lateral sides linking both ends of the top side to both ends of the bottom side. The first and second protrusions P1 and P2 further protrude above the top side of the inverted trapezoidal shape of the first extension EX1 when viewed in the second direction DR2. Each of the first protrusions P1 further protrudes in the left direction from a left one of the lateral sides of the inverted trapezoidal shape of the first extension EX1 when viewed in the second direction DR2, and each of the second protrusions P2 further protrudes in the right direction from a right one of the lateral sides of the inverted trapezoidal shape of the first extension EX1 when viewed in the second direction DR2.

The first extension EX1 includes a top surface extending from the top side of the inverted trapezoidal shape of the first extension EX1 in the second direction DR2, a bottom surface extending from the bottom side of the inverted trapezoidal shape in the second direction DR2, and side surfaces from the lateral sides of the inverted trapezoidal shape in the second direction DR2. A left one of the side surfaces may be defined as a left side surface, and a right one of the side surfaces may be defined as a right side surface.

The first recess G1 is defined in a portion of the first extension EX1 adjacent to a right side of each of the first protrusions P1, and the second recess G2 is defined in a portion of the first extension EX1 adjacent to a left side of each of the second protrusions P2. Each of the first recesses G1 may be formed by recessing the top surface and the right side surface of the first extension EX1 adjacent to the right side of each of the first protrusions P1. Each of the second recesses G2 may be formed by recessing the top surface and the left side surface of the first extension EX1 adjacent to the left side of each of the second protrusions P2. The portions of the first extension EX1, which define the first recesses G1 and the second recesses G2, may have concavely curved shapes.

A first hole H1 is defined in each of the first protrusions P1, and a second hole H2 is defined in each of the second protrusions P2. The first hole H1 has a cylindrical shape extending in the second direction DR2, and the second hole H2 also has a cylindrical shape extending in the second direction DR2. A vertex at which the top side and the left lateral side of the inverted trapezoidal shape meet each other overlaps with a central portion of each of the first holes H1 when viewed in the second direction DR2, and a vertex at which the top side and the right lateral side of the inverted trapezoidal shape meet each other overlaps with a central portion of each of the second holes H2 when viewed in the second direction DR2.

Referring to FIGS. 13 and 16, the second joint units JP2 have substantially the same structure as the first joint units JP1. The second joint units JP2 and the first joint units JP1 are disposed symmetrically with respect to the third joint unit JP3. In other words, if each of the second joint units JP2 is rotated 180 degrees, each of the second joint units JP2 has the same structure as each of the first joint units JP1. Each of the second joint units JP2 includes a second extension EX2 symmetrical to the first extension EX1, a plurality of third protrusions P3 symmetrical to the first protrusions P1, and a plurality of fourth protrusions P4 symmetrical to the second protrusions P2.

The second extensions EX2 have substantially the same structure as the first extensions EX1. Third recesses G3 symmetrical to the first recesses G1, and fourth recesses G4 symmetrical to the second recesses G2 are defined in the second extensions EX2. Third holes H3 symmetrical to the first holes H1 are defined in the third protrusions P3, and fourth holes H4 symmetrical to the second holes H2 are defined in the fourth protrusions P4.

Figure 17:
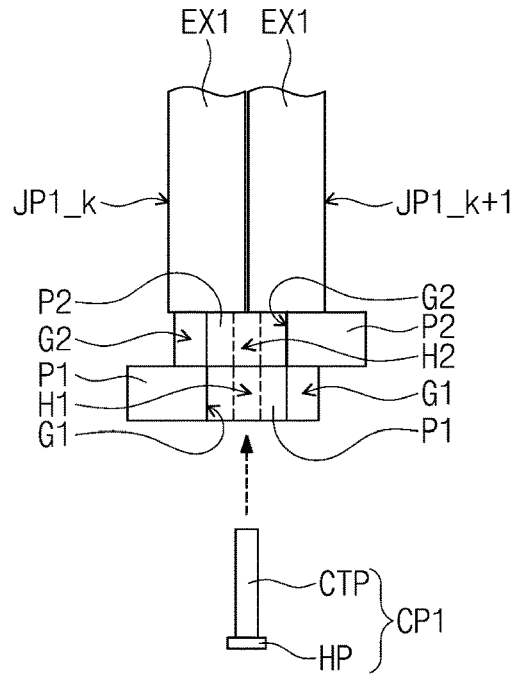
FIG. 17 is a view illustrating a connection state of two adjacent first joint units of the first joint units of FIG. 13.
Figure 18:
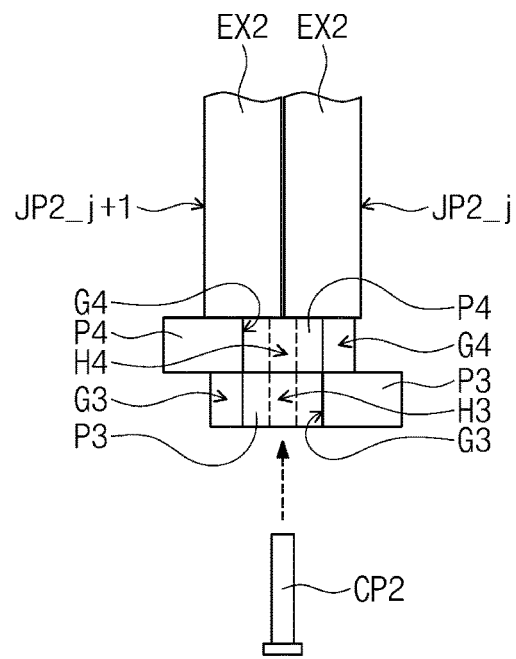
FIG. 18 is a view illustrating a connection state of two adjacent second joint units of the second joint units of FIG. 13.

FIG. 17 is a view illustrating a connection state of two adjacent first joint units JP1. FIG. 18 is a view illustrating a connection state of two adjacent second joint units JP2.

Portions of two first joint units JP1 and portions of two second joint units JP2 are illustrated in FIGS. 17 and 18 for the purpose of ease and convenience in description and illustration.

Referring to FIG. 17, a k+1$^{th}$ first joint unit JP1_k+1 is disposed at a right side of a k$^{th}$ first joint unit JP1_k. The second protrusions P2 of the k$^{th}$ first joint unit JP1_k are disposed in the second recesses G2 of the k+1$^{th}$ first joint unit JP1_k+1, and the first protrusions P1 of the k+1$^{th}$ first joint unit JP1_k+1 are disposed in the first recesses G1 of the k$^{th}$ first joint unit JP1_k.

Thus, the first protrusions P1 of the k+1$^{th}$ first joint unit JP1_k+1 overlap with the second protrusions P2 of the k$^{th}$ first joint unit JP1_k. The second holes H2 defined in the second protrusions P2 of the k$^{th}$ first joint unit JP1_k overlap with the first holes H1 defined in the first protrusions P1 of the k+1$^{th}$ first joint unit JP1_k+1. Referring to FIG. 14, portions of the first and second protrusions P1 and P2, which are disposed in the first and second recesses G1 and G2, may have convexly curved shapes corresponding to the concavely curved surfaces of the first extensions EX1 defining the first and second recesses G1 and G2.

Referring again to FIG. 17, the coupling pins CP include first coupling pins CP1 for connecting the k$^{th}$ and k+1$^{th}$ first joint units JP1_k and JP1_k+1 to each other. The first coupling pins CP1 are inserted in the first holes H1 defined in the first protrusions P1 of the k+1$^{th}$ first joint unit JP1_k+1 and the second holes H2 defined in the second protrusions P2 of the k$^{th}$ first joint unit JP1_k. One first coupling pin CP1 is illustrated in FIG. 17 for the purpose of ease and convenience in description and illustration. However, the first coupling pins CP1 are disposed at the both sides of each of the first joint units JP1, respectively. The first coupling pins CP1 are connected to the second protrusions P2 of the k$^{th}$ first joint unit JP1_k.

Each of the first coupling pins CP1 includes a head part HP having a size greater than each of the first and second holes H1 and H2 when viewed in the second direction DR2, and a coupling part CTP extending from the head part HP in the second direction DR2. Other coupling pins CP have the same components as the first coupling pin CP1. The coupling parts CTP have cylindrical shapes.

The coupling parts CTP are inserted in the first holes H1 of the k+1$^{th}$ first joint unit JP1_k+1 and the second holes H2 of the k$^{th}$ first joint unit JP1_k overlapping with each other and are connected to the second protrusions P2 of the k$^{th}$ first joint unit JP1_k. The coupling parts CTP are not connected to the first protrusions P1 of the k+1$^{th}$ first joint unit JP1_k+1.

For example, portions, inserted in the second holes H2 of the k$^{th}$ first joint unit JP1_k, of the coupling parts CTP and inner surfaces of the second holes H2 of the k$^{th}$ first joint unit JP1_k may have bolt screw shapes and nut screw shapes and may be coupled to each other. The head parts HP are not inserted in the first holes H1 of the k+1$^{th}$ first joint unit JP1_k+1 and are in contact with side surfaces of the first protrusions P1 of the k+1$^{th}$ first joint unit JP1_k+1.

Since the first coupling pins CP1 are not connected to the first protrusions P1 of the k+1$^{th}$ first joint unit JP1_k+1 but are connected to the second protrusions P2 of the k$^{th}$ first joint unit JP1_k, the k$^{th}$ first joint unit JP1_k and the k+1$^{th}$ first joint unit JP1_k+1 may rotate with respect to each other using the first coupling pins CP1 as a rotation axis.

Referring to FIG. 18, the second joint units JP2 may be connected to each other by substantially the same structure and method as the first joint units JP1. For example, a j+1$^{th}$ second joint unit JP2_j+1 is disposed at a left side of a j$^{th}$ second joint unit JP2_j, and the fourth protrusions P4 of the j$^{th}$ second joint unit JP2_j are disposed in the fourth recesses G4 of the j+1$^{th}$ second joint unit JP2_j+1. The third protrusions P3 of the j+1$^{th}$ second joint unit JP2_j+1 are disposed in the third recesses G3 of the j$^{th}$ second joint unit JP2_j.

Thus, the third protrusions P3 of the j+1$^{th}$ second joint unit JP2_j+1 overlap with the fourth protrusions P4 of the j$^{th}$ second joint unit JP2_j. The third holes H3 defined in the third protrusions P3 of the j+1$^{th}$ second joint unit JP2_j+1 overlap with the fourth holes H4 defined in the fourth protrusions P4 of the j$^{th}$ second joint unit JP2_j.

The coupling pins CP include second coupling pins CP2 for connecting the j$^{th}$ and j+1$^{th}$ second joint units JP2_j and JP2_j+1 to each other. The second coupling pins CP2 are inserted in the third and fourth holes H3 and H4 of the j$^{th}$ and j+1$^{th}$ second joint units JP2_j and JP2_j+1 overlapping with each other and are connected to the fourth protrusions P4 of the j$^{th}$ second joint unit JP2_j. Thus, the j$^{th}$ second joint unit JP2_j and the j+1$^{th}$ second joint unit JP2_j+1 may rotate with respect to each other using the second coupling pins CP2 as a rotation axis.

Figure 19:
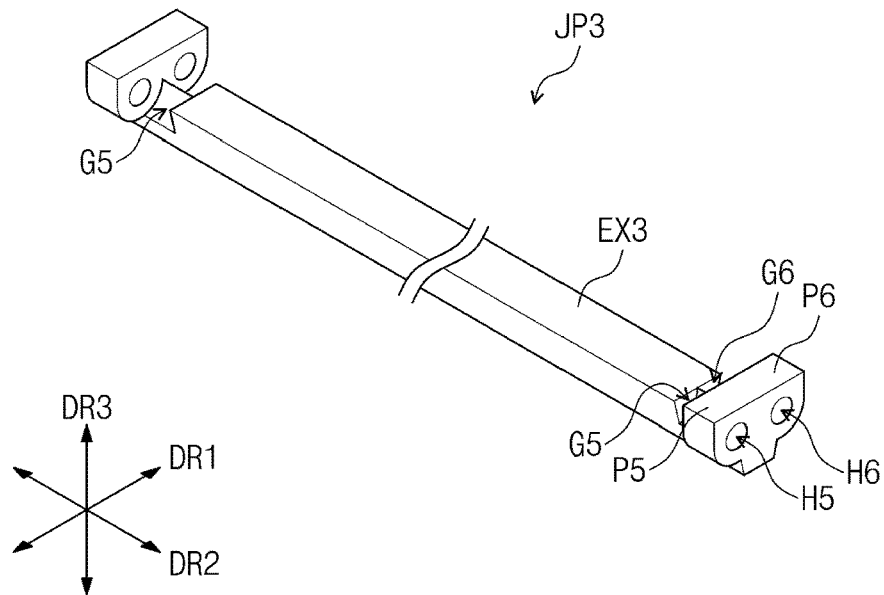
FIG. 19 is a perspective view illustrating the third joint unit of FIG. 13.
Figure 20:
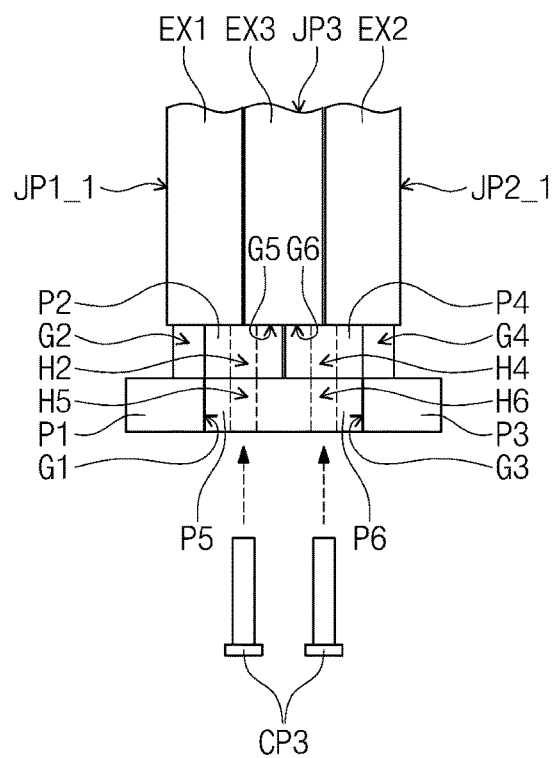
FIG. 20 is a view illustrating a connection state of the third joint unit, the first joint unit adjacent to the third joint unit, and the second joint unit adjacent to the third joint unit.

FIG. 19 is a perspective view illustrating the third joint unit JP3. FIG. 20 is a view illustrating a connection state of the third joint unit JP3, the first joint unit JP1 adjacent to the third joint unit JP3, and the second joint unit JP2 adjacent to the third joint unit JP3.

A portion of the first joint unit JP1, a portion of the second joint unit JP2, and a portion of the third joint unit JP3 are illustrated in FIG. 20 for the purpose of ease and convenience in description and illustration.

Referring to FIGS. 13 and 19, the third joint unit JP3 includes a third extension EX3, a plurality of fifth protrusions P5, and a plurality of sixth protrusions P6. The third extension EX3 has an inverted trapezoidal shape when viewed in the second direction DR2. The fifth and sixth protrusions P5 and P6 protrude from both sides, opposite to each other in the second direction DR2, of the third extension EX3 in the first direction DR1.

The fifth protrusions P5 have the same structure as the first protrusions P1 of each of the first joint units JP1 and overlap with the first protrusions P1 when viewed in the first direction DR1. The sixth protrusions P6 have the same structure as the third protrusions P3 of each of the second joint units JP2 and overlap with the third protrusions P3 when viewed in the first direction DR1. The fifth protrusion P5 and the sixth protrusion P6 protrude from each of the both sides of the third extension EX3 in opposite directions from each other. The fifth protrusion P5 protrudes in the left direction and the sixth protrusion P6 protrudes in the right direction.

A fifth hole H5 extending in the second direction DR2 is defined in each of the fifth protrusions P5, and a sixth hole H6 extending in the second direction DR2 is defined in each of the sixth protrusions P6. The fifth holes H5 have the same shape as the first holes H1, and the sixth holes H6 have the same shape as the third holes H3.

Fifth recesses G5 and sixth recesses G6 are defined in the third extension EX3. The fifth recesses G5 have the same shape as the second recesses G2 of each of the first joint units JP1, and the sixth recesses G6 have the same shape as the fourth recesses G4 of each of the second joint units JP2. The fifth recesses G5 overlap with the second recesses G2 when viewed in the first direction DR1, and the sixth recesses G6 overlap with the fourth recesses G4 when viewed in the first direction DR1.

Herein, the first joint unit JP1 adjacent to the third joint unit JP3 is defined as a first sub-joint unit JP1_1, and the second joint unit JP2 adjacent to the third joint unit JP3 is defined as a second sub-joint unit JP2_1.

Referring to FIG. 20, the third joint unit JP3, the first sub-joint unit JP1_1, and the second sub-joint unit JP2_1 are connected to each other by substantially the same method as the first joint units JP1. For example, the second protrusions P2 of the first sub-joint unit JP1_1 are disposed in the fifth recesses G5, and the fifth protrusions P5 are disposed in the first recesses G1 of the first sub-joint unit JP1_1. The fourth protrusions P4 of the second sub-joint unit JP2_1 are disposed in the sixth recesses G6, and the sixth protrusions P6 are disposed in the third recesses G3 of the second sub-joint unit JP2_1.

The second protrusions P2 of the first sub-joint unit JP1_1 overlap with the fifth protrusions P5, and the fourth protrusions P4 of the second sub-joint unit JP2_1 overlap with the sixth protrusions P6. The coupling pins CP include third coupling pins CP3 for connecting the third joint unit JP3 and the first and second sub-joint units JP1_1 and JP2_1 to each other. The third coupling pins CP3 are inserted in the fifth holes H5 of the third joint unit JP3 and the second holes H2 of the first sub-joint unit JP1_1 overlapping with each other and in the sixth holes H6 of the third joint unit JP3 and the fourth holes H4 of the second sub-joint unit JP2_1 overlapping with each other.

The third coupling pins CP3 are connected to the second protrusions P2 of the first sub-joint unit JP1_1 and the fourth protrusions P4 of the second sub-joint unit JP2_1. Thus, the third joint unit JP3, the first sub-joint unit JP1_1, and the second sub-joint unit JP2_1 may be connected to each other to rotate with respect to each other.

Figure 21:
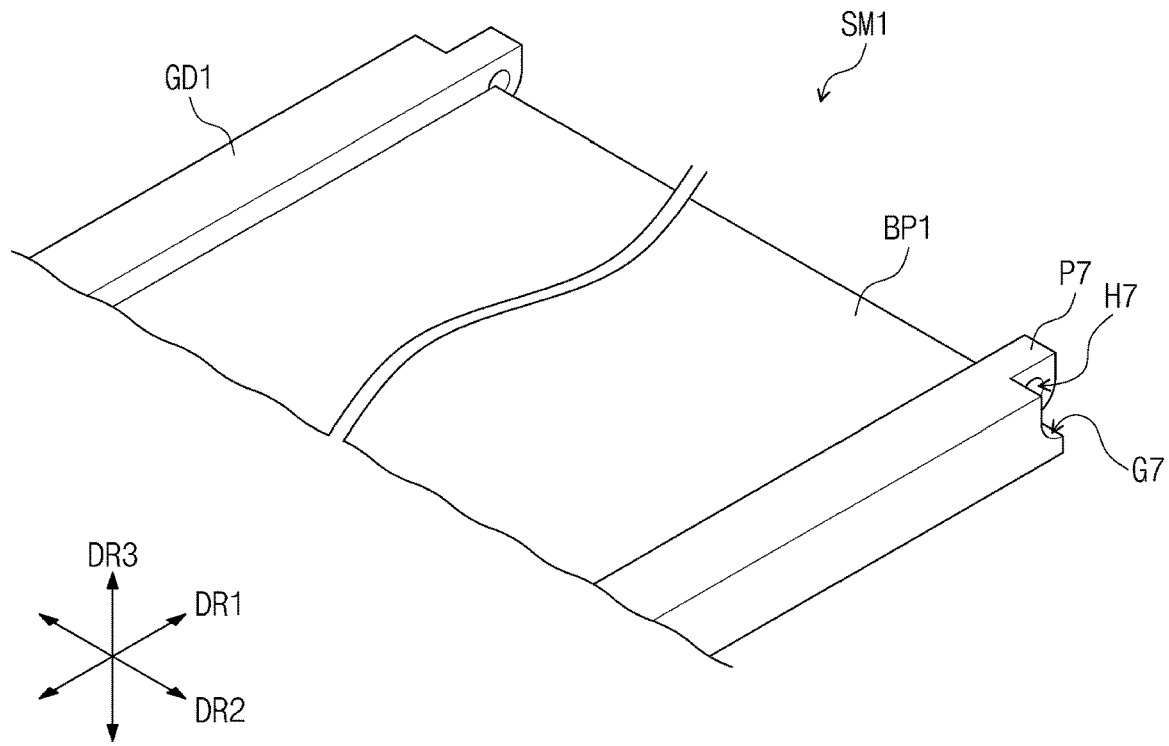
FIG. 21 is a perspective view illustrating one side of the first support member of FIG. 13.
Figure 22:
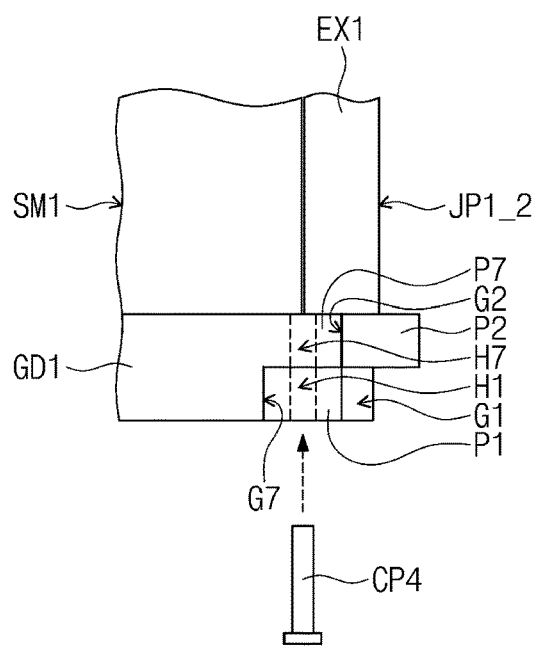
FIG. 22 is a view illustrating a connection state of the one side of the first support member of FIG. 21 and the first joint unit adjacent to the first support member.

FIG. 21 is a perspective view illustrating one side of the first support member SM1; and FIG. 22 is a view illustrating a connection state of the one side of the first support member SM1 and the first joint unit JP1 adjacent to the first support member SM1.

Referring to FIGS. 13 and 21, the first support member SM1 includes a plurality of seventh protrusions P7 that protrude from the one side of the first support member SM1 and have a same structure as the second protrusions P2 of each of the first joint units JP1. The seventh protrusions P7 overlap with the second protrusions P2 when viewed in the first direction DR1. The seventh protrusions P7 substantially protrude from the first guide part GD1.

Seventh recesses G7 are defined in the one side of the first support member SM1 and have a same shape as the first recesses G1 of each of the first joint units JP1. The seventh recesses G7 overlap with the first recesses G1 when viewed in the first direction DR1. A seventh hole H7 extending in the second direction DR2 is defined in each of the seventh protrusions P7. The seventh holes H7 have a same shape as the second holes H2.

Herein, the first joint unit JP1 adjacent to the first support member SM1 is defined as a third sub-joint unit JP1_2.

Referring to FIG. 22, the first protrusions P1 of the third sub-joint unit JP1_2 are disposed in the seventh recesses G7, and the seventh protrusions P7 are disposed in the second recesses G2 of the third sub-joint unit JP1_2. The first protrusions P1 of the third sub-joint unit JP1_2 overlap with the seventh protrusions P7.

The coupling pins CP include fourth coupling pins CP4 for connecting the one side of the first support member SM1 and the third sub-joint unit JP1_2 to each other. The fourth coupling pins CP4 are inserted in the first holes H1 of the third sub-joint unit JP1_2 and the seventh holes H7 of the first support member SM1 overlapping with each other and are connected to the seventh protrusions P7. Thus, the one side of the first support member SM1 and the third sub-joint unit JP1_2 may be connected to each other to rotate with respect to each other.

Figure 23:
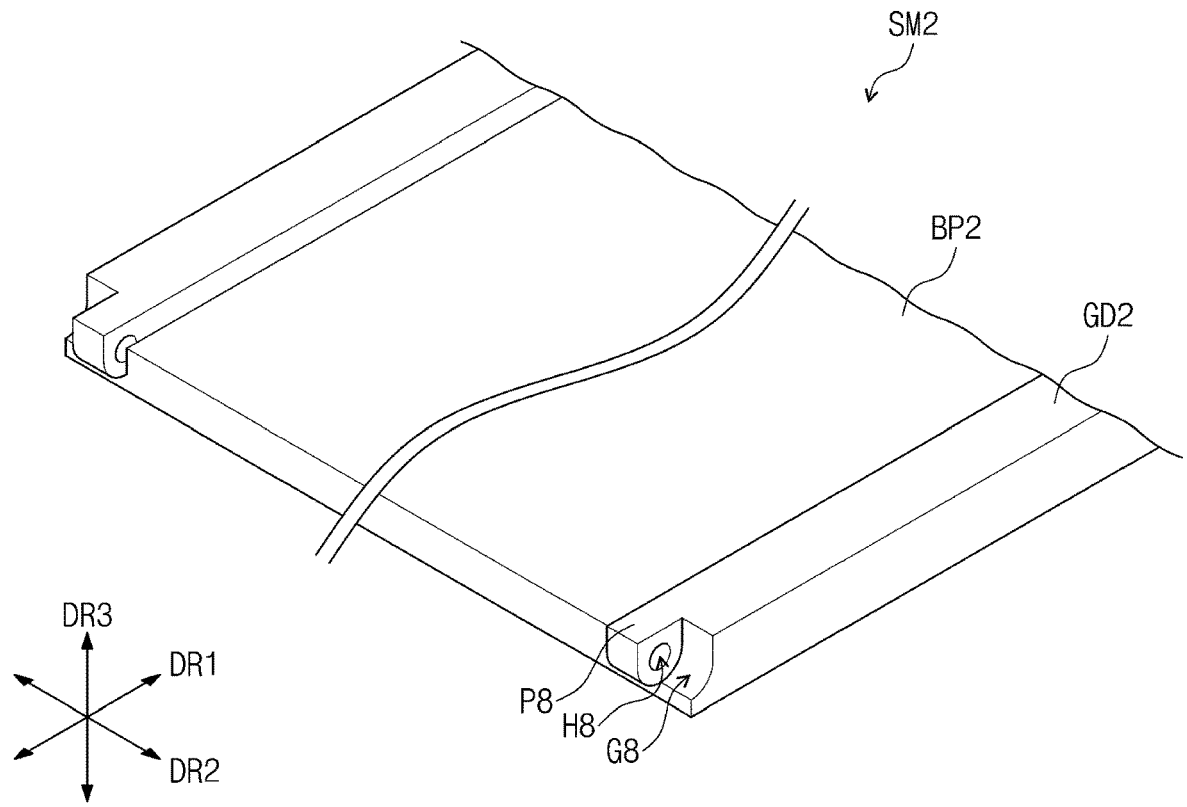
FIG. 23 is a perspective view illustrating one side of the second support member of FIG. 13.
Figure 24:
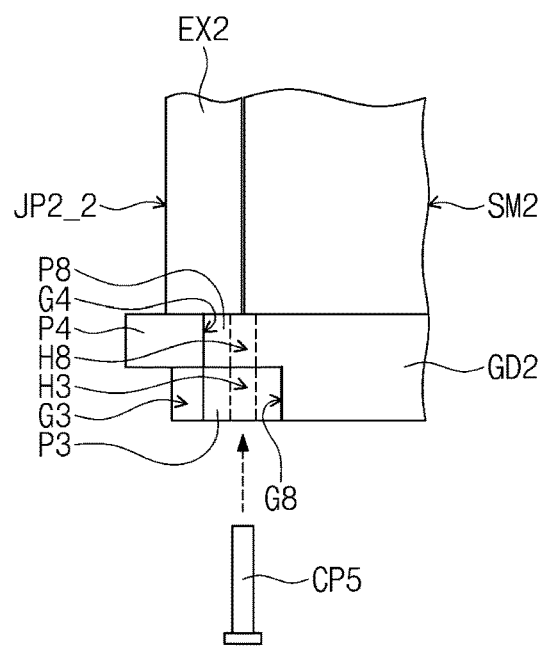
FIG. 24 is a view illustrating a connection state of the one side of the second support member of FIG. 23 and the second joint unit adjacent to the second support member.

FIG. 23 is a perspective view illustrating one side of the second support member SM2; and FIG. 24 is a view illustrating a connection state of the one side of the second support member SM2 and the second joint unit JP2 adjacent to the second support member SM2.

Referring to FIGS. 13 and 23, the one side of the second support member SM2 has a shape symmetrical to the shape of the one side of the first support member SM1. The second support member SM2 includes a plurality of eighth protrusions P8 that protrude from the one side of the second support member SM2 and have a same structure as the fourth protrusions P4 of each of the second joint units JP2. The eighth protrusions P8 overlap with the fourth protrusions P4 when viewed in the first direction DR1.

Eighth recesses G8 are defined in the one side of the second support member SM2 and have a same shape as the third recesses G3 of each of the second joint units JP2. The eighth recesses G8 overlap with the third recesses G3 when viewed in the first direction DR1. An eighth hole H8 extending in the second direction DR2 is defined in each of the eighth protrusions P8. The eighth holes H8 have a same shape as the fourth holes H4.

Herein, the second joint unit JP2 adjacent to the second support member SM2 is defined as a fourth sub-joint unit JP2_2.

Referring to FIG. 24, the third protrusions P3 of the fourth sub-joint unit JP2_2 are disposed in the eighth recesses G8, and the eighth protrusions P8 are disposed in the fourth recesses G4 of the fourth sub-joint unit JP2_2. The third protrusions P3 of the fourth sub-joint unit JP2_2 overlap with the eighth protrusions P8.

The coupling pins CP include fifth coupling pins CP5 for connecting the one side of the second support member SM2 and the fourth sub-joint unit JP2_2 to each other. The fifth coupling pins CP5 are inserted in the third holes H3 of the fourth sub-joint unit JP2_2 and the eighth holes H8 of the second support member SM2 overlapping with each other and are connected to the eighth protrusions P8. Thus, the one side of the second support member SM2 and the fourth sub-joint unit JP2_2 may be connected to each other to rotate with respect to each other.

Figure 25:
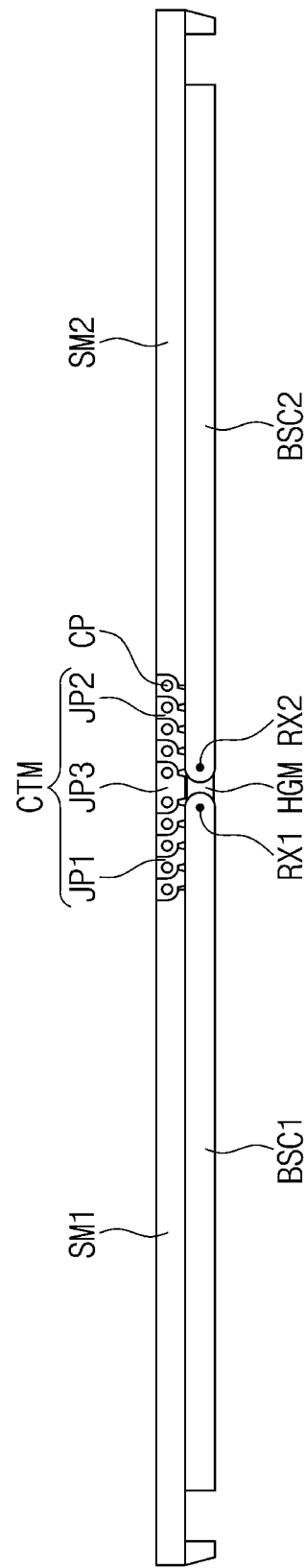
FIG. 25 is a side view illustrating the support member of FIGS. 5 and 6, in which first to fourth support members, a connection member, a hinge member, sliding units, and first and second back surface covers are coupled to each other.
Figure 26:
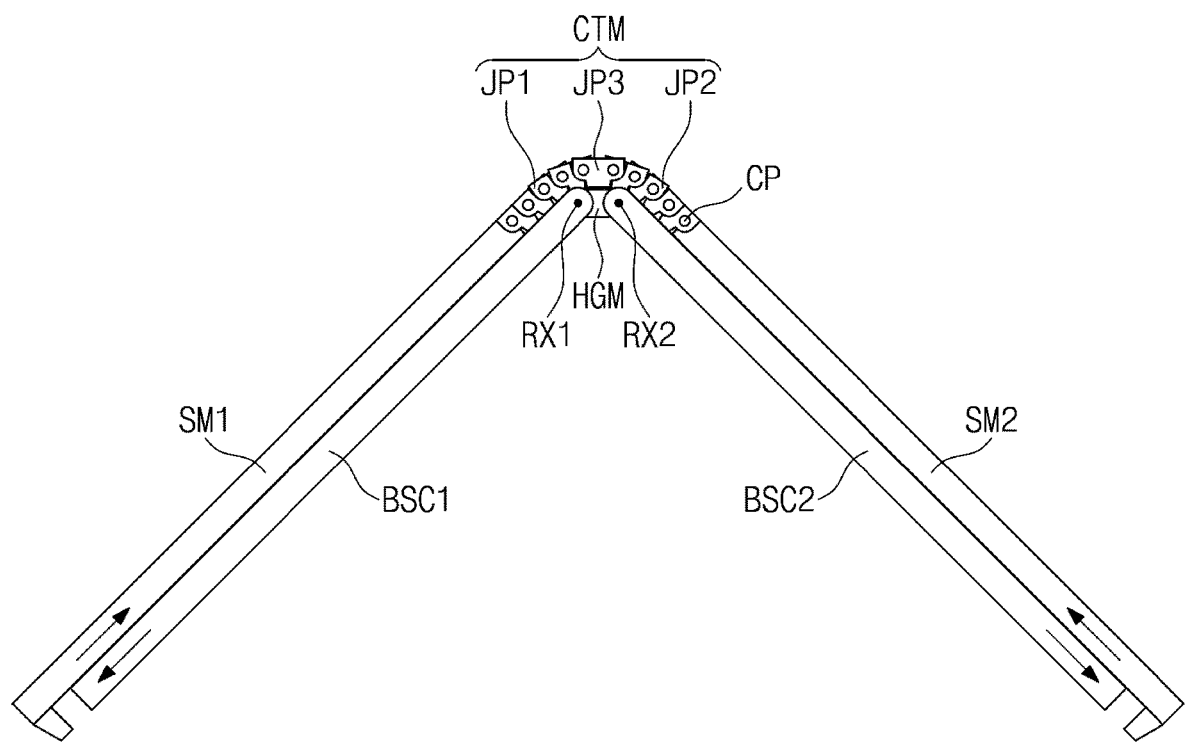
FIGS. 26 and 27 are views illustrating folded states of the display apparatus according to an embodiment of the invention.
Figure 27:
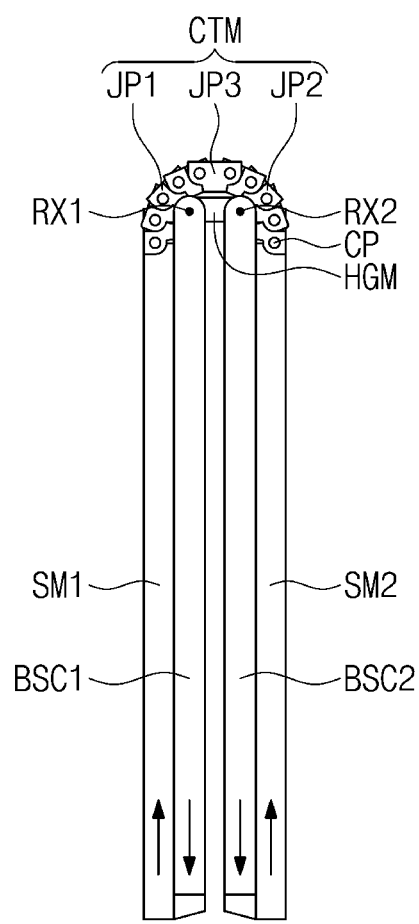

FIG. 25 is a side view illustrating the support member of FIGS. 5 and 6 in which the first to fourth support members SM1 to SM4, the connection member CTM, the hinge member HGM, the sliding units SU, and the first and second back surface covers BSC1 and BSC2 are coupled to each other. FIGS. 26 and 27 are views illustrating folded states of the display apparatus according to an embodiment of the invention.

Referring to FIG. 25, the display module 100 is disposed on the first bottom part BP1, the second bottom part BP2, and the first to third extensions EX1 to EX3. The display module 100 may be covered by the first and second guide parts GD1 and GD2 and the first to eighth protrusions P1 to P8 and thus may not be visible when viewed in a side view of the display apparatus 1000.

Referring to FIGS. 26 and 27, the display apparatus 1000 may be folded on the first rotation axis RX1 and the second rotation axis RX2 of the hinge member HGM. When the display apparatus 1000 is folded, the support member 200 may out-fold the display apparatus 1000 such that the display surface DS of the display module 100 is exposed outward.

When the display apparatus 1000 is out-folded, the first and second support members SM1 and SM2 and the first and second back surface covers BSC1 and BSC2 may relatively slide in opposite directions to each other. For example, the first and second support members SM1 and SM2 may move toward a central portion of the display apparatus 1000, and the first and second back surface covers BSC1 and BSC2 may relatively move in directions opposite to the movement directions of the first and second support members SM1 and SM2.

Since the first and second back surface covers BSC1 and BSC2 are connected to the third and fourth support members SM3 and SM4, the first and second support members SM1 and SM2 and the third and fourth support members SM3 and SM4 may relatively slide in opposite directions to each other when the display apparatus 1000 is out-folded.

FIG. 28 is a view illustrating positions of the sliding units SU when the display apparatus is stretched out like illustrated in FIG. 25; and FIG. 29 is a view illustrating positions of the sliding units SU when the display apparatus is folded like illustrated in FIG. 27.

For the purpose of ease and convenience in description, FIGS. 28 and 29 illustrate cross-sectional views corresponding to FIG. 8.

Referring to FIG. 28, when the display apparatus 1000 is stretched out, the sliding units SU and the lower protrusions LP are disposed in first side regions of the sliding holes SH.

Referring to FIG. 29, when the display apparatus 1000 is out-folded, the sliding units SU and the lower protrusions LP move in directions opposite to the movement directions of the third and fourth support members SM3 and SM4. Thus, the sliding units SU and the lower protrusions LP may move along the sliding holes SH and then may be disposed in second side regions of the sliding holes SH.

If the first and second support members SM1 and SM2 were connected and fixed to the third and fourth support members SM3 and SM4, the display apparatus 1000 would not be foldable. However, according to embodiments of the invention, the first and second support members SM1 and SM2 and the third and fourth support members SM3 and SM4 may relatively slide and may move in the opposite directions to each other, and thus the display apparatus 1000 can be normally folded.

Figure 30:
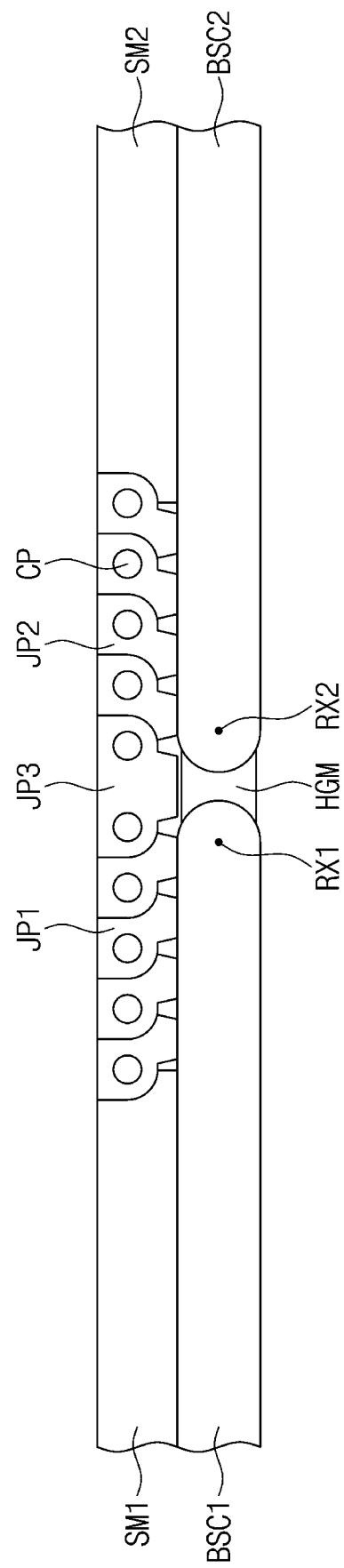
FIG. 30 is an enlarged view of the joint units illustrated in FIG. 25.
Figure 31:
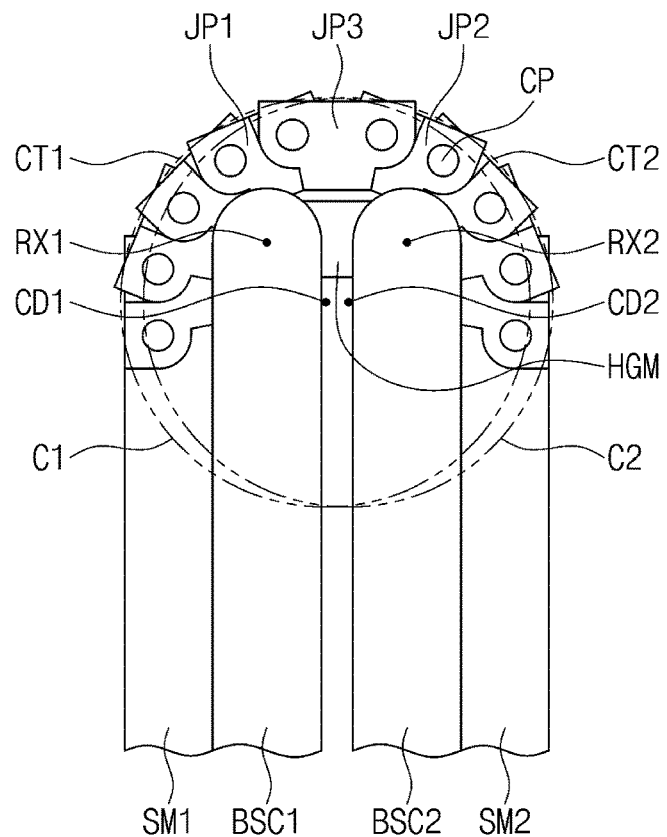
FIG. 31 is an enlarged view of the joint units illustrated in FIG. 27.

FIG. 30 is an enlarged view of the joint units JP1 to JP3 illustrated in FIG. 25; FIG. 31 is an enlarged view of the joint units JP1 to JP3 illustrated in FIG. 27; and FIG. 32 is a view illustrating first and second reference circles of FIG. 31 and third and fourth circles of which central points correspond to first and second rotation axes.

Figure 32:
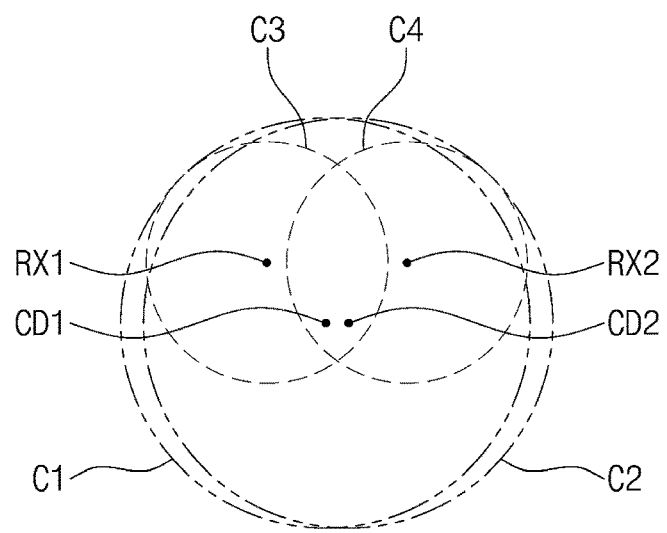
FIG. 32 is a view illustrating first and second reference circles of FIG. 31 and third and fourth circles of which central points correspond to first and second rotation axes.

Referring to FIGS. 30, 31, and 32, the first, second, and third joint units JP1, JP2, and JP3 disposed in the stretched state may be arranged along at least one curved trajectory when the support member 200 rotates on the first rotation axis RX1 and the second rotation axis RX2. The at least one curved trajectory may be defined as a partial curved line (e.g., an arc) of a reference circle. Herein, two curved trajectories defined as partial curved lines of two reference circles will be described as an example.

When the support member 200 rotates on the first rotation axis RX1 and the second rotation axis RX2 to fold the display module 100, the first joint units JP1 rotate with respect to each other so as to be arranged along a first curved trajectory CT1, and the second joint units JP2 rotate with respect to each other so as to be arranged along a second curved trajectory CT2. The first curved trajectory CT1 and the second curved trajectory CT2 may be symmetrical. The reference circle may include a first reference circle C1 and a second reference circle C2. The first curved trajectory CT1 may be defined as a partial curved line (e.g., an arc) of the first reference circle C1, and the second curved trajectory CT2 may be defined as a partial curved line (e.g., an arc) of the second reference circle C2.

The folding area FA of the display module 100 may be folded or bent by the first, second, and third joint units JP1, JP2, and JP3. When the support member 200 is folded, the side surfaces of the first extensions EX1 of the first joint units JP1 may be disposed to be in contact with each other, and the side surfaces of the second extensions EX2 of the second joint units JP2 may also be disposed to be in contact with each other.

A first central point CD1 of the first reference circle C1 including the first curved trajectory CT1 does not overlap with the first rotation axis RX1, and a second central point CD2 of the second reference circle C2 including the second curved trajectory CT2 does not overlap with the second rotation axis RX2. The first and second central points CD1 and CD2 are spaced apart from the first and second rotation axes RX1 and RX2. A distance between the first central point CD1 and the second central point CD2 is smaller than a distance between the first rotation axis RX1 and the second rotation axis RX2.

Each of first and second reference circles C1 and C2 having the first and second central points CD1 and CD2 may have a first curvature, and each of third and fourth circles C3 and C4 using the first and second rotation axes RX1 and RX2 as central points may have a second curvature. Each of the first and second circles C1 and C2 is larger than each of the third and fourth circles C3 and C4. Since a curvature decreases as a size of a circle increases, the first curvature is smaller than the second curvature.

When the folding area FA of the display module 100 is bent, stress may occur at the folding area FA. The stress may increase as a bending degree of the folding area FA increases (i.e. as a curvature of the folding area FA increases), and, thus, the folding area FA may be deformed. The stress occurring when the folding area FA is bent with the first curvature may be smaller than the stress occurring when the folding area FA is bent with the second curvature. In other words, the folding area FA may be bent with the first curvature to reduce the stress of the folding area FA, and, thus, deformation of the folding area FA may be reduced or minimized.

In the embodiments of the invention, the first and second joint units JP1 and JP2 are arranged along the first and second curved trajectories CT1 and CT2 having the first curvature when the display module 100 is folded, and, thus, the folding area FA of the display module 100 can be more gently folded. Thus, the display apparatus 1000 according to the embodiments of the invention can relax or reduce the stress of the folding area FA of the display module 100 to reduce deformation of the folding area FA.

In the above embodiment, the support member 200 rotates on the first and second rotation axes RX1 and RX2. However, embodiments of the invention are not limited thereto. In certain embodiments, only the first and third support members SM1 and SM3 may rotate on the first rotation axis RX1, or only the second and fourth support members SM2 and SM4 may rotate on the second rotation axis RX2. When only the first and third support members SM1 and SM3 rotate on the first rotation axis RX1, only the first joint units JP1 may be arranged along the first curved trajectory CT1. When only the second and fourth support members SM2 and SM4 rotate on the second rotation axis RX2, only the second joint units JP2 may be arranged along the second curved trajectory CT2.

Figure 33:
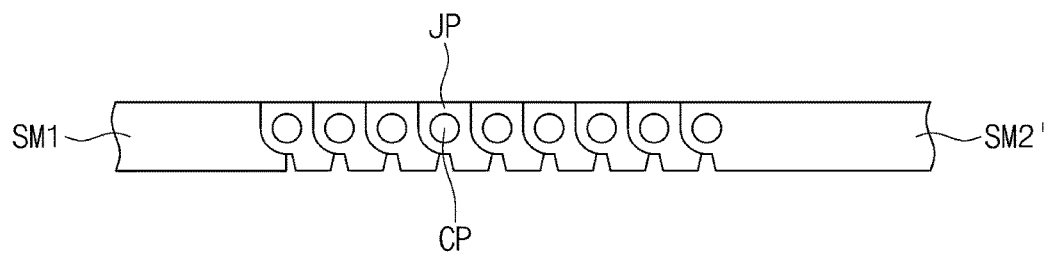
FIG. 33 is a view illustrating joint units of a support member of a display apparatus according to another embodiment of the invention.
Figure 34:
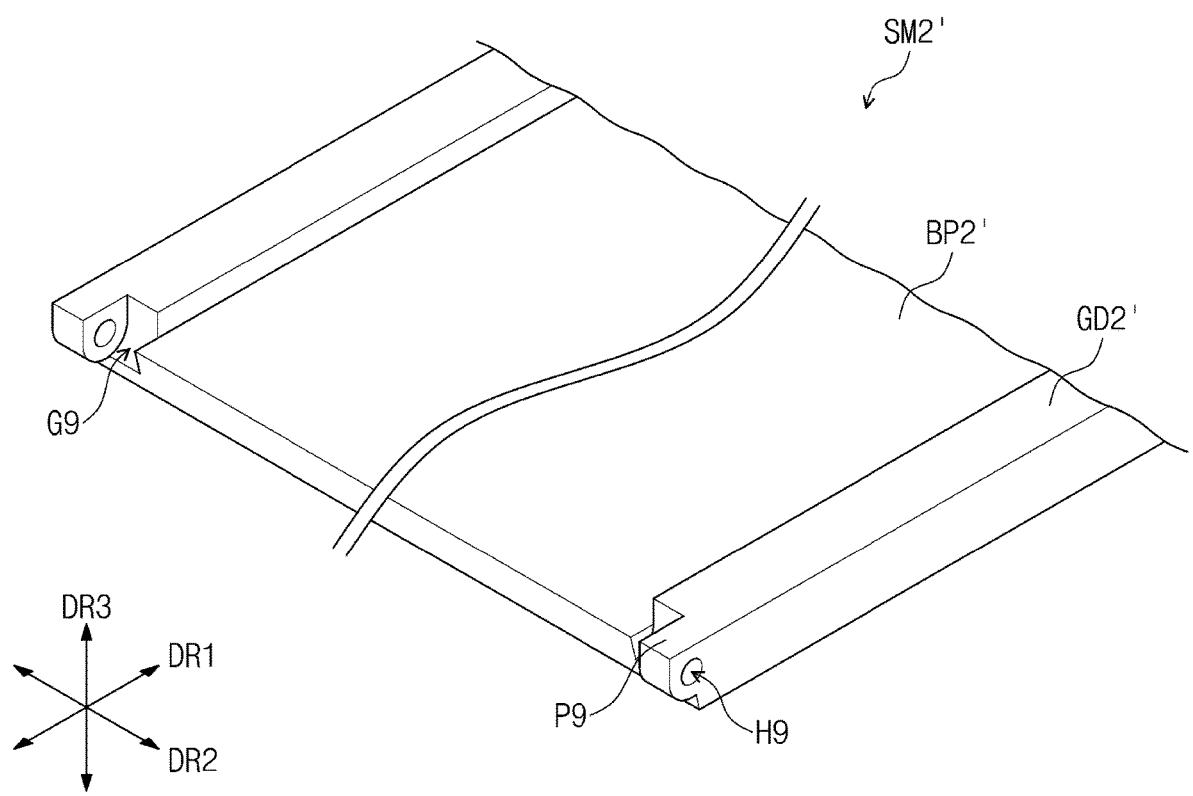
FIG. 34 is a perspective view illustrating one side of a second support member of the support member of FIG. 33.

FIG. 33 is a view illustrating joint units of a support member of a display apparatus according to another embodiment of the invention; FIG. 34 is a perspective view illustrating one side of a second support member of the support member of FIG. 33; and FIG. 35 is a view illustrating a connection state of the one side of the second support member of FIG. 34 and a joint unit of the joint units that is adjacent to the second support member.

Except for joint units JP and a second support member SM2' of a support member 200', other components of a display apparatus according to another embodiment of the invention may be the same as corresponding components of the display apparatus 1000 described above. Thus, the components of the present embodiment different from corresponding components of the display apparatus 1000 will be mainly described hereinafter, and the same components as in the above embodiment will be indicated by the same reference designators.

Figure 35:
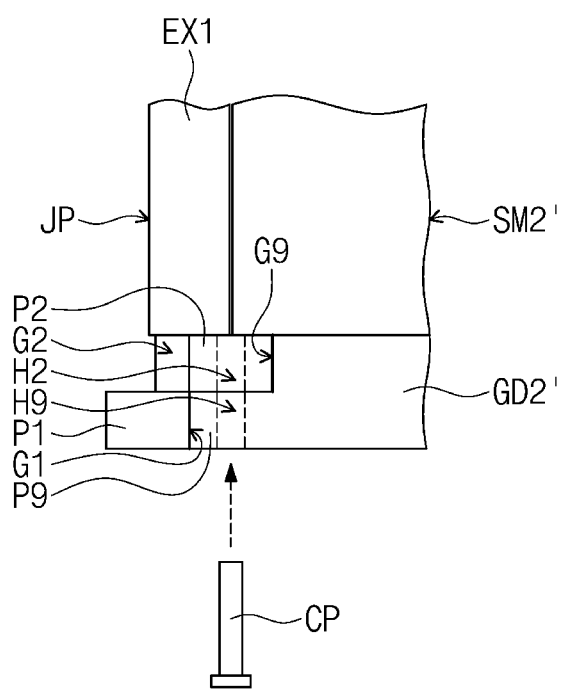
FIG. 35 is a view illustrating a connection state of the one side of the second support member of FIG. 34 and a joint unit of the joint units that is adjacent to the second support member.

Referring to FIGS. 33, 34, and 35, a plurality of joint units JP is disposed between a first support member SM1 and a second support member SM2' including a second bottom part BP2' and a second guide part GD2'. One side of the first support member SM1, the joint units JP, and one side of the second support member SM2' facing the one side of the first support member SM1 are coupled to each other by coupling pins CP to rotate with respect to each other.

The first joint units JP1 described above are used as the joint units JP, but the second and third joint units JP2 and JP3 are not used as the joint units JP. In other words, the joint units JP may have the same structure as the first joint units JP1 illustrated in FIGS. 13 to 15. The first support member SM1 may have the same structure as the first support member SM1 illustrated in FIG. 21. Thus, further description of components and a connection structure of the joint units JP and the first support member SM1 is omitted.

The second support member SM2' includes a plurality of ninth protrusions P9 protruding from the one side of the second support member SM2'. The ninth protrusions P9 have a same structure as the first protrusions P1 of each of the joint units JP and overlap with the first protrusions P1 when viewed in the first direction DR1.

Ninth recesses G9 are defined in the one side of the second support member SM2' and have a same shape as the second recesses G2 of each of the joint units JP. The ninth recesses G9 overlap with the second recesses G2 when viewed in the first direction DR1. Ninth holes H9 extending in the second direction DR2 are defined in the ninth protrusions P9. The ninth holes H9 have a same shape as the first holes H1.

The second protrusions P2 of the joint unit JP adjacent to the second support member SM2' are disposed in the ninth recesses G9, and the ninth protrusions P9 are disposed in the first recesses G1 of the joint unit JP adjacent to the second support member SM2'. The ninth protrusions P9 overlap with the second protrusions P2 of the joint unit JP adjacent to the second support member SM2'.

The coupling pins CP are inserted in the ninth holes H9 of the second support member SM2' and the second holes H2 of the joint unit JP adjacent to the second support member SM2' and are connected to the second protrusions P2 of the joint unit JP adjacent to the second support member SM2'. As a result, the one side of the second support member SM2' and the joint unit JP adjacent thereto may be coupled to each other to rotate with respect to each other.

Figure 36:
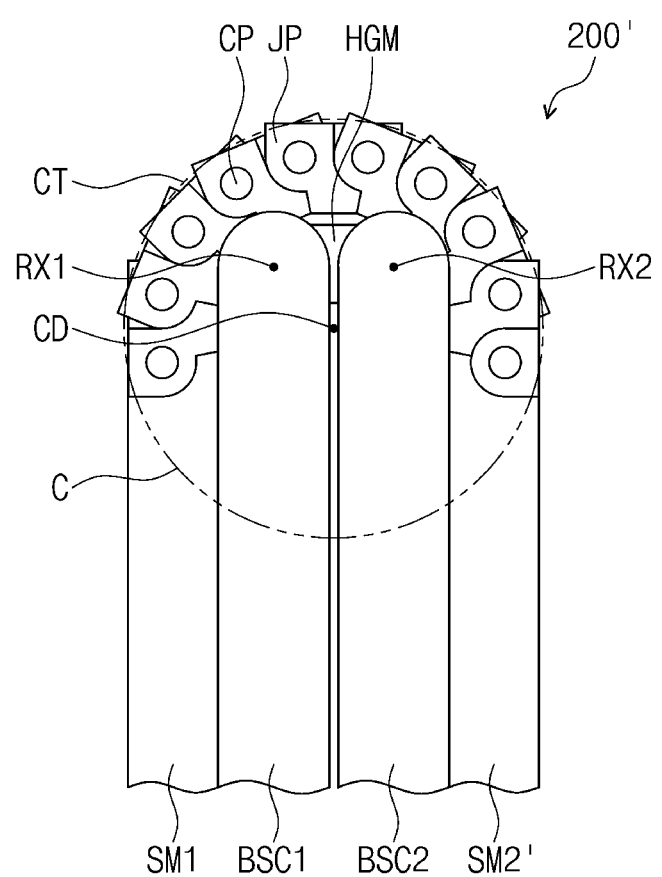
FIG. 36 is a view illustrating an arranged state of the joint units of FIG. 33 when the display apparatus according to another embodiment of the invention is folded.

FIG. 36 is a view illustrating an arranged state of the joint units of FIG. 33 when the display apparatus according to another embodiment of the invention is folded.

Referring to FIG. 36, when the support member 200' is folded on the first rotation axis RX1 and the second rotation axis RX2, the joint units JP rotate with respect to each other so as to be arranged along a curved trajectory CT. The curved trajectory CT may be defined as a partial curved line of a reference circle C, and a central point CD of the reference circle C is spaced apart from the first and second rotation axes RX1 and RX2. As a result, the folding area FA of the display module 100 can be gently folded to relax or reduce stress of the folding area FA of the display module 100, and, thus, deformation of the folding area FA can be reduced or minimized.

According to embodiments of the invention, the joint units supporting the folding area of the display module may be arranged along a curved trajectory (e.g., a predetermined curved trajectory) when the display module is folded, and, thus, the folding area of the display module may be gently folded. As a result, the display apparatus according to embodiments of the invention may relax or reduce stress of the folding area and may reduce deformation of the folding area.

While the invention has been described with reference to some example embodiments, it will be apparent to those skilled in the art that various changes and modifications may be made without departing from the spirit and scope of the invention. Therefore, it is to be understood that the above embodiments are not limiting but, rather, are illustrative. Thus, the scope of the invention is to be determined by the broadest permissible interpretation of the following claims and their equivalents, and is not to be restricted or limited by the foregoing description.

What is claimed is:
1. A display apparatus comprising:
   a first support member and a second support member arranged in a first direction;
   a plurality of joint units arranged in the first direction and extending in a second direction crossing the first direction, wherein the joint units are arranged between the first and second support members so as to be connected to the first and second support members and are coupled to be rotatable with respect to each other;
   a display module on the first and second support members and having flexibility;
   a third support member under the first support member;
   a fourth support member under the second support member;
   a hinge member respectively providing a first rotation axis and a second rotation axis, which extend in the second direction, to one side of the third support member and one side of the fourth support member facing each other; and
   a plurality of sliding units connected to bottoms of the first and second support members and disposed under the third and fourth support members.
2. The display apparatus of claim 1, wherein the joint units are arranged along at least one curved trajectory when the third and fourth support members rotate on the first and second rotation axes, respectively, wherein the at least one curved trajectory is defined as a partial curved line of a reference circle, and wherein a central point of the reference circle is spaced apart from the first and second rotation axes.

3. The display apparatus of claim 2, wherein the joint units comprise:

a plurality of first joint units coupled to be rotatable with respect to each other;

a plurality of second joint units having shapes symmetrical to shapes of the first joint units and coupled to be rotatable with respect to each other; and a third joint unit arranged between the plurality of first joint units and the plurality of second joint units, wherein the third joint unit is coupled to a first joint unit of the plurality of first joint units and a second joint unit of the plurality of second joint units, which are adjacent to the third joint unit, to be rotatable with respect to each other.

4. The display apparatus of claim 3, wherein the first and second support members out-fold the display module such that the display module is exposed outward, when the third and fourth support members rotate on the first and second rotation axes, respectively.

5. The display apparatus of claim 4, wherein the reference circle comprises a first reference circle and a second reference circle, wherein the first joint units are arranged along a first curved trajectory defined as a partial curved line of the first reference circle, wherein the second joint units are arranged along a second curved trajectory defined as a partial curved line of the second reference circle, wherein a first central point of the first reference circle and a second central point of the second reference circle are spaced apart from the first and second rotation axes, and wherein a distance between the first central point and the second central point is smaller than a distance between the first rotation axis and the second rotation axis.

6. The display apparatus of claim 3, wherein the first joint units are arranged between the third joint unit and one side of the first support member, wherein the second joint units are arranged between the third joint unit and one side of the second support member facing the one side of the first support member, wherein the one side of the first support member and the first joint unit adjacent to the one side of the first support member are coupled to be rotatable with respect to each other, and wherein the one side of the second support member and the second joint unit adjacent to the one side of the second support member are coupled to be rotatable with respect to each other.

7. The display apparatus of claim 6, further comprising a plurality of coupling pins extending in the second direction and coupling the one side of the first support member, the first joint units, the third joint unit, the second joint units, and the one side of the second support member to be rotatable with respect to each other.

8. The display apparatus of claim 7, wherein each of the first joint units comprises:

a first extension extending in the second direction and having an inverted trapezoidal shape when viewed in the second direction;

a plurality of first protrusions protruding from both sides, opposite to each other in the second direction, of the first extension in a left direction of the first direction; and a plurality of second protrusions adjacent to the first protrusions and protruding from the first extension in a right direction of the first direction, wherein the second protrusions have shapes symmetrical to shapes of the first protrusions when viewed in the second direction, and wherein the first and second protrusions do not overlap with each other and are alternately arranged at the both sides of the first extension when viewed in the first direction.

9. The display apparatus of claim 8, wherein the second protrusions are closer to a center of the first extension than the first protrusions in each of the first joint units when viewed in the first direction, wherein the first protrusions protrude in the left direction from a reference line extending in the second direction in a central portion of the first extension and the second protrusions protrude in the right direction from the reference line, in each of the first joint units, wherein each of the first and second protrusions protrudes above a top side of the inverted trapezoidal shape in each of the first joint units when viewed in the second direction, wherein each of the first protrusions further protrudes in the left direction from a left one of lateral sides linking the top side of the inverted trapezoidal shape to a bottom side of the inverted trapezoidal shape when viewed in the second direction, wherein each of the second protrusions further protrudes in the right direction from a right one of the lateral sides when viewed in the second direction, wherein a vertex at which the top side and the left lateral side of the inverted trapezoidal shape meet each other overlaps with a central portion of a first hole defined in each of the first protrusions, in each of the first joint units, when viewed in the second direction, and wherein a vertex at which the top side and the right lateral side of the inverted trapezoidal shape meet each other overlaps with a central portion of a second hole defined in each of the second protrusions, in each of the first joint units, when viewed in the second direction.

10. The display apparatus of claim 9, wherein a first recess is defined in a portion of the first extension adjacent to a right side of each of the first protrusions, and a second recess is defined in a portion of the first extension adjacent to a left side of each of the second protrusions, in each of the first joint units, wherein second protrusions of a $k^{th}$ first joint unit of the first joint units are arranged in second recesses of a $k+1^{th}$ first joint unit arranged at a right side of the $k^{th}$ first joint unit, wherein first protrusions of the $k+1^{th}$ first joint unit are arranged in first recesses of the $k^{th}$ first joint unit, wherein the first protrusions of the $k+1^{th}$ first joint unit overlap with the second protrusions of the $k^{th}$ first joint unit, wherein first coupling pins of the coupling pins are inserted in first holes of the $k+1^{th}$ first joint unit and second holes of the $k^{th}$ first joint unit, which overlap with each other, and wherein the $k^{th}$ and $k+1^{th}$ first joint units are rotatable with respect to each other by using the first coupling pins as a rotation axis.

11. The display apparatus of claim 10, wherein each of the second joint units comprises:
- a second extension symmetrical to the first extension;
- a plurality of third protrusions symmetrical to the first protrusions; and
- a plurality of fourth protrusions symmetrical to the second protrusions,
- wherein a plurality of third recesses symmetrical to the first recesses and a plurality of fourth recesses symmetrical to the second recesses are defined in each of the second extensions,
- wherein third holes symmetrical to the first holes are defined in the third protrusions, and fourth holes symmetrical to the second holes are defined in the fourth protrusions,
- wherein fourth protrusions of a $j^{th}$ second joint unit of the second joint units are arranged in fourth recesses of a $j+1^{th}$ second joint unit arranged at a left side of the $j^{th}$ second joint unit,
- wherein third protrusions of the $j+1^{th}$ second joint unit are arranged in third recesses of the $j^{th}$ second joint unit,
- wherein the third protrusions of the $j+1^{th}$ second joint unit overlap with the fourth protrusions of the $j^{th}$ second joint unit,
- wherein second coupling pins of the coupling pins are inserted in third holes of the $j+1^{th}$ second joint unit and fourth holes of the $j^{th}$ second joint unit, which overlap with each other, and
- wherein the $j^{th}$ and $j+1^{th}$ second joint units are rotatable with respect to each other by using the second coupling pins as a rotation axis.

12. The display apparatus of claim 11, wherein the third joint unit comprises:
- a third extension extending in the second direction and having an inverted trapezoidal shape when viewed in the second direction;
- a plurality of fifth protrusions protruding from both sides of the third extension opposite to each other in the second direction, wherein the fifth protrusions have same structures as the first protrusions of each of the first joint units; and
- a plurality of sixth protrusions protruding from the both sides of the third extension and having same structures as the third protrusions of each of the second joint units,
- wherein a plurality of fifth recesses and a plurality of sixth recesses are defined in the third extension,
- wherein the fifth recesses have same shapes as the second recesses of each of the first joint units and the sixth recesses have same shapes as the fourth recesses of each of the second joint units,
- wherein a fifth hole extending in the second direction is defined in each of the fifth protrusions, and a sixth hole extending in the second direction is defined in each of the sixth protrusions,
- wherein second protrusions of a first sub-joint unit defined as the first joint unit adjacent to the third joint unit are arranged in the fifth recesses,
- wherein the fifth protrusions are arranged in first recesses of the first sub-joint unit and overlap with the second protrusions of the first sub-joint unit,
- wherein fourth protrusions of a second sub-joint unit defined as the second joint unit adjacent to the third joint unit are arranged in the sixth recesses,
- wherein the sixth protrusions are arranged in third recesses of the second sub-joint unit and overlap with the fourth protrusions of the second sub-joint unit,
- wherein third coupling pins of the coupling pins are inserted in the fifth holes and second holes of the first sub-joint unit overlapping with each other and the sixth holes and fourth holes of the second sub-joint unit overlapping with each other, and
- wherein the third joint unit and the first and second sub-joint units are rotatable with respect to each other by using the third coupling pins as a rotation axis.

13. The display apparatus of claim 11, wherein the first support member comprises a plurality of seventh protrusions protruding from the one side of the first support member and having same structures as the second protrusions of each of the first joint units,
- wherein a plurality of seventh recesses having same shapes as the first recesses of each of the first joint units are defined in the one side of the first support member,
- wherein a seventh hole extending in the second direction is defined in each of the seventh protrusions,
- wherein first protrusions of a third sub-joint unit defined as the first joint unit adjacent to the first support member are arranged in the seventh recesses,
- wherein the seventh protrusions are arranged in second recesses of the third sub-joint unit and overlap with the first protrusions of the third sub-joint unit,
- wherein fourth coupling pins of the coupling pins are inserted in first holes of the third sub-joint unit and the seventh holes of the first support member, which overlap with each other, and
- wherein the one side of the first support member and the third sub-joint unit are rotatable with respect to each other by using the fourth coupling pins as a rotation axis.

14. The display apparatus of claim 11, wherein the second support member comprises a plurality of eighth protrusions protruding from the one side of the second support member and having same structures as the fourth protrusions of each of the second joint units,
- wherein a plurality of eighth recesses having same shapes as the third recesses of each of the second joint units are defined in the one side of the second support member,
- wherein an eighth hole extending in the second direction is defined in each of the eighth protrusions,
- wherein third protrusions of a fourth sub-joint unit defined as the second joint unit adjacent to the second support member are arranged in the eighth recesses,
- wherein the eighth protrusions are arranged in fourth recesses of the fourth sub-joint unit and overlap with the third protrusions of the fourth sub-joint unit,
- wherein fifth coupling pins of the coupling pins are inserted in third holes of the fourth sub-joint unit and the eighth holes of the second support member, which overlap with each other, and
- wherein the one side of the second support member and the fourth sub-joint unit are rotatable with respect to each other by using the fifth coupling pins as a rotation axis.

15. The display apparatus of claim 1, wherein the sliding units are connected to bottoms of the first and second support members through a plurality of sliding holes defined in the third and fourth support members,
- wherein the sliding holes and the sliding units extend in the first direction, and the sliding units move in the first direction along the sliding holes.

16. The display apparatus of claim 15, wherein each of the sliding units comprises:
- an insertion part extending in the first direction and inserted in a corresponding one of the sliding holes so as to be connected to a corresponding one of the bottoms of the first and second support members; and a support part connected to a bottom of the insertion part and having a size larger than a size of the insertion part when viewed in a third direction perpendicular to a plane parallel to the first and second directions.

17. The display apparatus of claim 16, wherein a width of each of the support parts in the second direction is greater than a width of each of the sliding holes in the second direction, wherein the support parts are in contact with bottom surfaces of the third and fourth support members adjacent to the sliding holes, and wherein a length of each of the insertion parts in the first direction is shorter than a length of each of the sliding holes in the first direction.

18. The display apparatus of claim 16, further comprising:

a plurality of lower protrusions overlapping with the insertion parts and protruding downward from the bottom of each of the first and second support members, wherein a length of each of the lower protrusions in the first direction is shorter than a length of each of the sliding holes in the first direction, and wherein the lower protrusions are inserted in the sliding holes and are connected to the insertion parts.

19. The display apparatus of claim 15, further comprising first and second back surface covers arranged under the third and fourth support members to cover the third and fourth support members and the sliding units.

20. The display apparatus of claim 1, wherein the hinge member comprises a plurality of hinge parts arranged in the second direction and arranged between the third support member and the fourth support member in the first direction, and wherein each of the hinge parts is connected to the one side of the third support member and the one side of the fourth support member to provide the first and second rotation axes to the one side of the third support member and the one side of the fourth support member.

21. The display apparatus of claim 20, wherein each of the hinge parts comprises:

a body part extending in the second direction and comprising: a first rotation unit providing the first rotation axis and extending in the second direction; and a second rotation unit providing the second rotation axis and extending in the second direction; and a plurality of sub-connection parts arranged at both sides, opposite to each other in the second direction, of the body part so as to be connected to the first and second rotation units, wherein the sub-connection parts extend in the first direction and are connected to bottoms of the third and fourth support members, wherein the first rotation unit and the second rotation unit are rotatable on the first rotation axis and the second rotation axis, respectively.

22. The display apparatus of claim 1, wherein the first support member comprises:

a first bottom part; and a first guide part protruding upward from other sides of the first bottom part except one side of the first bottom part, wherein the second support member comprises:

a second bottom part; and a second guide part protruding upward from other sides of the second bottom part except one side of the second bottom part, wherein the one side of the first bottom part and the one side of the second bottom part face each other.

23. The display apparatus of claim 22, wherein the display module comprises:

a folding area on the joint units; and non-folding areas on the first and second bottom parts, wherein the folding area is between the non-folding areas.

24. The display apparatus of claim 1, wherein the plurality of joint units is made up of an even number of the joint units.

25. The display apparatus of claim 24, wherein the first and second support members out-fold the display module such that the display module is exposed outward, when the third and fourth support members rotate on the first and second rotation axes, and wherein the joint units are arranged along a single curved trajectory when the display module is out-folded.

26. The display apparatus of claim 1, wherein the first and second support members and the sliding units move in opposite directions with the third and fourth support members.

* * * * *